US 9,443,749 B2

United States Patent
Wakabayashi et al.

(10) Patent No.: US 9,443,749 B2
(45) Date of Patent: Sep. 13, 2016

(54) VACUUM PROCESSING APPARATUS

(75) Inventors: Shinji Wakabayashi, Yamanashi (JP); Sensho Kobayashi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 334 days.

(21) Appl. No.: 13/980,474

(22) PCT Filed: Jan. 18, 2012

(86) PCT No.: PCT/JP2012/000271
§ 371 (c)(1),
(2), (4) Date: Jul. 18, 2013

(87) PCT Pub. No.: WO2012/098871
PCT Pub. Date: Jul. 26, 2012

(65) Prior Publication Data
US 2013/0302115 A1 Nov. 14, 2013

(30) Foreign Application Priority Data

Jan. 20, 2011 (JP) ................................ 2011-009859

(51) Int. Cl.
*H01L 21/677* (2006.01)
*H01L 21/67* (2006.01)

(52) U.S. Cl.
CPC ... *H01L 21/67703* (2013.01); *H01L 21/67196* (2013.01); *H01L 21/67742* (2013.01)

(58) Field of Classification Search
CPC .............. H01L 21/67173; H01L 21/67184; H01L 21/67201; H01L 21/67196; H01L 21/67703
See application file for complete search history.

(56) References Cited

U.S. PATENT DOCUMENTS

| 6,382,895 B1 * | 5/2002 | Konishi | ............ H01L 21/67167 414/217 |
| 6,440,261 B1 * | 8/2002 | Tepman | ............ H01L 21/67161 118/715 |
| 7,874,782 B2 * | 1/2011 | Hashimoto | ....... H01L 21/67766 414/217 |

(Continued)

FOREIGN PATENT DOCUMENTS

| JP | 2004-289036 A | 10/2004 |
| JP | 2006-156762 A | 6/2006 |

(Continued)

OTHER PUBLICATIONS

International Search Report mailed on Apr. 24, 2012 in PCT/JP2012/000271.

*Primary Examiner* — Michael McCullough
*Assistant Examiner* — Mark Hageman
(74) *Attorney, Agent, or Firm* — Rothwell, Figg, Ernst & Manbeck, P.C.

(57) ABSTRACT

In this vacuum processing apparatus, four process modules and four load-rock modules are arranged in clusters around a two-stage conveyance vacuum chamber. In the apparatus, the entirety of the second stage of the vacuum conveyance chamber is a third vacuum conveyance area and the third vacuum conveyance area extends from the second stage to the first stage through an aperture to enter between first and second vacuum conveyance areas. A third vacuum conveyance robot has: left and right-side conveyance units, which can move straight in the depth direction in the second stage of the third vacuum conveyance area; and left and right-side conveyance units, which can move straight in the vertical direction, i.e. can move up and down, in the aperture of the vacuum conveyance area.

17 Claims, 9 Drawing Sheets

(56) References Cited

U.S. PATENT DOCUMENTS

| | | | |
|---|---|---|---|
| 8,303,232 B2* | 11/2012 | Ishida | H01L 21/67781 414/222.01 |
| 8,443,513 B2* | 5/2013 | Ishida | H01L 21/67051 29/771 |
| 9,184,071 B2* | 11/2015 | Ogura | H01L 21/67173 |
| 2004/0191028 A1 | 9/2004 | Tamai | |
| 2005/0232727 A1 | 10/2005 | Ferrara | |
| 2006/0182532 A1 | 8/2006 | Okada et al. | |
| 2006/0245852 A1* | 11/2006 | Iwabuchi | H01L 21/67201 414/217 |
| 2007/0243049 A1 | 10/2007 | Ferrara | |
| 2007/0292244 A1 | 12/2007 | Moore et al. | |
| 2008/0138175 A1 | 6/2008 | Mitchell et al. | |
| 2009/0092466 A1 | 4/2009 | Moore et al. | |
| 2011/0110752 A1* | 5/2011 | Tauchi | H01L 21/67184 414/217 |
| 2011/0238201 A1 | 9/2011 | Hiroki | |

FOREIGN PATENT DOCUMENTS

| | | | |
|---|---|---|---|
| JP | 2009-64864 A | | 3/2009 |
| JP | 2009-260087 A | | 11/2009 |
| JP | 2010-147207 A | | 7/2010 |
| JP | 2010147207 | * | 7/2010 |
| WO | 2006/041530 A2 | | 4/2006 |
| WO | 2007/146643 A2 | | 12/2007 |
| WO | 2008/070004 A2 | | 6/2008 |

\* cited by examiner

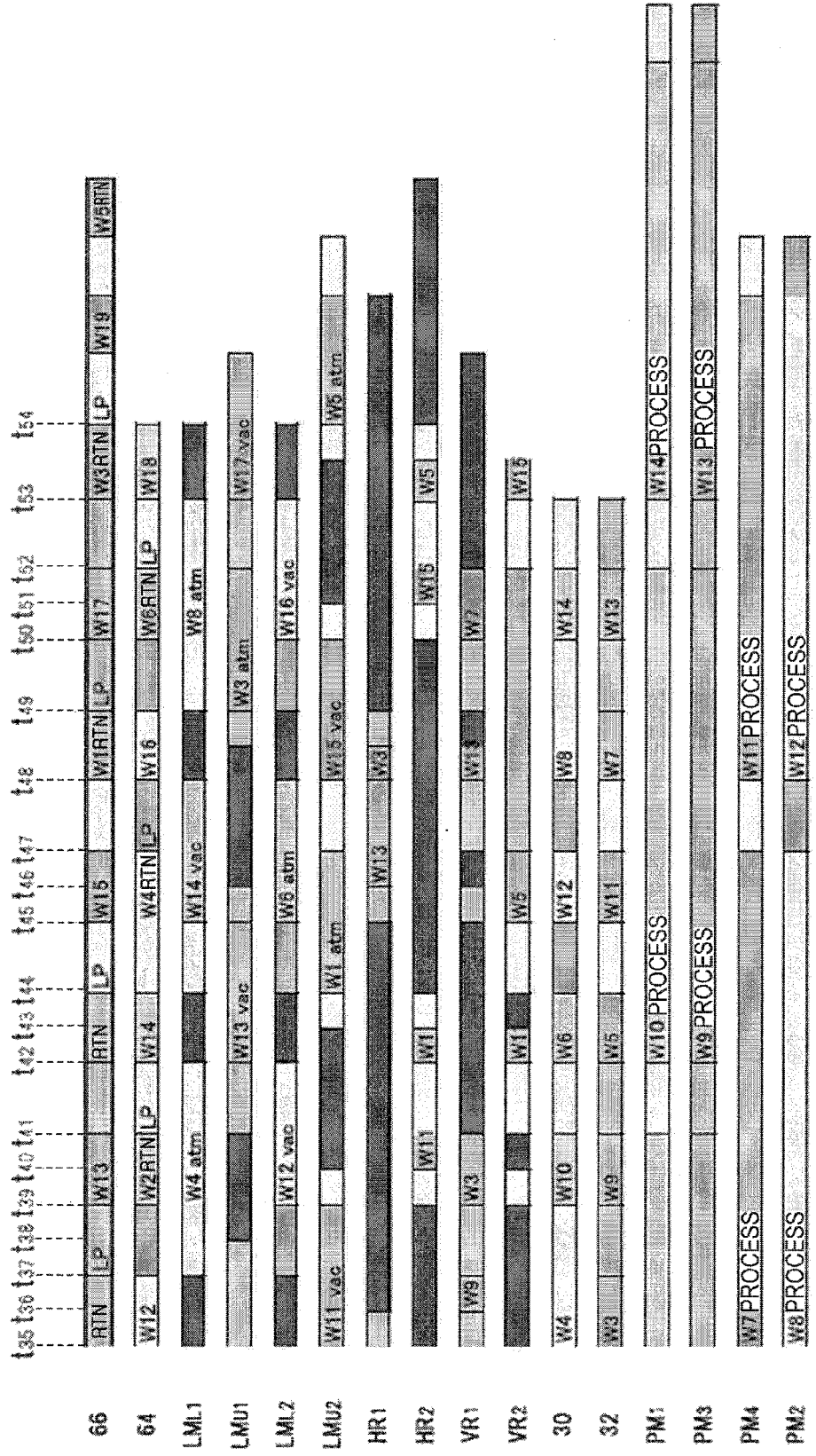

US 9,443,749 B2

VACUUM PROCESSING APPARATUS

CROSS REFERENCE TO RELATED APPLICATION

This application is a 35 U.S.C. 371 National Phase Entry Application from PCT/JP2012/000271, filed Jan. 18, 2012, which claims the benefit of Japanese Patent Application No. 2011-009859, filed Jan. 20, 2011, the disclosures of which are incorporated herein in their entirety by reference.

TECHNICAL FIELD

The present invention relates to a cluster tool type vacuum processing system, and more particularly to a vacuum processing apparatus in which a plurality of vacuum conveyance mechanisms are provided within a vacuum conveyance chamber.

BACKGROUND

A cluster tool type vacuum processing system is well known as a type of a vacuum processing system including a vacuum conveyance chamber. In the cluster tool type vacuum processing system, a plurality of process modules that perform a predetermined processing under reduced pressure are arranged around a vacuum conveyance chamber in order to facilitate consistency, linking or complexation of processes. The cluster tool type vacuum processing system is also referred to as a multi-chamber type and is typically employed in a semiconductor manufacturing apparatus.

Recently, in such a cluster tool type vacuum processing apparatus, a layout becomes a trend in which the vacuum processing apparatus is additionally equipped with a process module along a long side of the vacuum conveyance chamber by increasing the size of the vacuum conveyance chamber in the depth direction while reducing or maintaining the width size of the entire apparatus, when viewed from a load port side where loading/unloading of a cassette configured to accommodate non-processed substrates or processing-finished substrates is performed. See, e.g., Patent Document 1.

In a cluster tool type vacuum processing system in which the vacuum conveyance chamber is extended in the depth direction and a plurality of process modules are arranged in the depth direction as described above, a configuration is employed in which the conveyance space within the vacuum conveyance chamber is divided into a plurality of vacuum conveyance areas each of which is provided with a vacuum conveyance robot configured to give and take substrates with the process modules around the vacuum conveyance area, and a relay table is arranged adjacent to a boundary between vacuum conveyance areas so as to allow the vacuum robots to give and take substrates with each other. See, e.g., Patent Document 2. In this case, when viewed from a load-lock module that interfaces an atmosphere space of the load port side and the reduced pressure space within the vacuum conveyance chamber, the vacuum conveyance robot in front of the load-lock module and an inner vacuum conveyance robot are configured to be connected in series through the relay table.

PRIOR ART DOCUMENT

Patent Document

Patent Document 1: Japanese Patent Laid-Open Publication No. 2005-534176
Patent Document 2: U.S. Pat. No. 6,440,261

DISCLOSURE OF THE INVENTION

Problem to be Solved by the Invention

A conventional cluster tool that employs a configuration in which a plurality of vacuum conveyance robots are serially connected within a vacuum conveyance chamber as described above reaches the limit in conveyance capability when all the process modules are made to uniformly perform the same single process in parallel or when a plurality of process modules which are divided into two or more groups based on vacuum conveyance areas are made to perform the same composite process in parallel.

In such a case, each of the vacuum conveyance robots should sequentially conduct an operation of receiving a non-processed substrate from a load-lock module, an operation of making a substrate enter into or exit from each of the process modules around the vacuum conveyance area of responsibility, and an operation of transmitting a processing-finished substrate to the load-lock module side, within a predetermined cycle. However, the vacuum conveyance robot adjacent to load-lock module at the front side is additionally assigned with a task of relaying the transmission of a non-processed substrate or a processing-finished substrate which is performed between the load-lock module and an inner side vacuum conveyance robot in addition to a series of conveyance tasks assigned within the vacuum conveyance area of responsibility. Thus, the conveyance load is concentrated to the front side vacuum conveyance robot and the conveyance capability of the entire system reaches the limit here, and thus the throughput is limited. This problem becomes more remarkable when a process time is shorter and may cause serious restrictions in throughput in a short time process of, for example, not more than one minute or not more than 30 sec.

In addition, when a plurality of process modules are made to perform the same single process or composite process as described above, at the load port side, loading of non-processed substrates and unloading of processing-finished substrates should be frequently and rapidly performed intensively (in time for entry and exit of all the substrates in all the load-lock modules) on one cassette which takes over substrates for which a lot-processing is being performed or started. Thus, in addition to the improvement of conveyance efficiency in the vacuum conveyance chamber, the improvement of conveyance efficiency in the atmosphere conveyance chamber becomes a problem to be solved.

The present invention has been made to solve problems in the prior art as described above and provides a vacuum processing apparatus that improves the conveyance efficiency and throughput of a vacuum conveyance system including a plurality of vacuum conveyance mechanisms.

In addition, the present invention provides a vacuum processing apparatus that improves the conveyance efficiency of an atmosphere conveyance system in which a substrate is conveyed between a load port and a load-lock module.

Means to Solve the Problems

A vacuum processing apparatus according to a first aspect of the present invention includes: a vacuum conveyance chamber of which the interior is maintained in a reduced pressure state; first and second vacuum conveyance areas formed in the vacuum conveyance chamber to be separated from each other in a horizontal direction; a first set of process modules and a first set of load-lock modules arranged around the vacuum conveyance chamber adjacent to the first vacuum conveyance area; a second set of process modules arranged around the vacuum conveyance chamber adjacent to the second vacuum conveyance area; a first vacuum conveyance mechanism configured to access to the first set of process modules and the first set of load-lock modules to give and take a substrate with each module of an access place and convey the substrate within the first vacuum conveyance area; a second vacuum conveyance mechanism configured to access to the second set of process modules to give and take a substrate with each module of an access place and convey the substrate within the second vacuum conveyance area; a second set of load-lock modules arranged on a floor higher or lower than the first set of load-lock modules; a third vacuum conveyance area provided adjacent to the second load-lock modules within the vacuum conveyance chamber and connected to the second vacuum conveyance area; and a third vacuum conveyance mechanism configured to access to the second set of load-lock modules to give and take a substrate with each module of an access place and to give and take the substrate with the second vacuum conveyance mechanism at a first transfer position formed in the third vacuum conveyance area so as to convey the substrate in the third vacuum conveyance area.

In the vacuum processing apparatus configured as described above, the first vacuum conveyance mechanism and the second vacuum conveyance mechanism are operated independently from each other. Thus, the first vacuum conveyance mechanism may perform only the conveyance of wafers within the first vacuum conveyance area without needing to engage in (relay) the conveyance of wafers between the second set (second floor) of load-lock modules and the second set of process modules. Accordingly, the conveyance load is not concentrated to the first vacuum conveyance mechanism. Thus, since the conveyance load is distributed evenly or correspondingly, the efficiency of the entire system are high and thus, the throughput of a short time process in a cluster tool may be enhanced.

A vacuum processing apparatus according to a second aspect of the present invention includes: a vacuum conveyance chamber of which the interior is maintained in a reduced pressure state; one or more process modules provided in parallel to each other around the vacuum conveyance chamber to perform a predetermined processing to a substrate within an interior under reduced pressure; a plurality of load-lock modules provided in parallel to each other around the vacuum conveyance chamber and each having an interior which is selectively switched to an atmosphere state or a reduced pressure state, the plurality of load-lock modules temporally holding a substrate conveyed between the atmosphere space and the vacuum conveyance chamber; one or more vacuum conveyance mechanisms provided in the vacuum conveyance chamber so as to convey a substrate between any one of the load-lock modules and any one of the process modules or between different process modules; a first load port provided at a predetermined position in an atmosphere space opposite to the plurality of load-lock modules so as to load or unload a cassette configured to accommodate a plurality of substrates in parallel to each other at a regular interval such that the plurality of substrates may enter into or exit from the cassette; a first atmosphere conveyance mechanism configured to convey a substrate between a first cassette laid on the first load port and any one of the load-lock modules; and a second atmosphere conveyance mechanism configured to convey a substrate between the first cassette on the first load port and any one of other load-lock modules. The first and second atmosphere conveyance mechanisms alternately perform loading or unloading of a substrate in relation to the first cassette one by one.

In the vacuum processing apparatus configured as described above, the first and second atmosphere conveyance robots may alternately access to the first cassette CR, for which a lot-processing is being performed or started, on the first load port to perform the unloading/loading of semiconductor wafers W rapidly and smoothly. Thus, the atmosphere conveyance robots of the present exemplary embodiment may considerably enhance the conveyance efficiency of the atmosphere system and cope with the high throughput of the vacuum system without any difficulty.

Effect of the Invention

According to the vacuum processing apparatus of the present invention, the conveyance efficiency and throughput of a vacuum conveyance system including a plurality of vacuum conveyance mechanisms may be enhanced and further the conveyance efficiency of an atmosphere conveyance system that conveys wafers between a load port and a load-lock module may also be enhanced due to the configurations and operations as described above.

BRIEF DESCRIPTION OF THE DRAWINGS

FIG. 6B is a timing diagram for describing an exemplary embodiment of the entire operation in the vacuum processing apparatus.

DETAILED DESCRIPTION TO EXECUTE THE INVENTION

Hereinafter, exemplary embodiments of the present invention will be described with reference to accompanying drawings.

[Entire Configuration of Apparatus]

Figure 1:
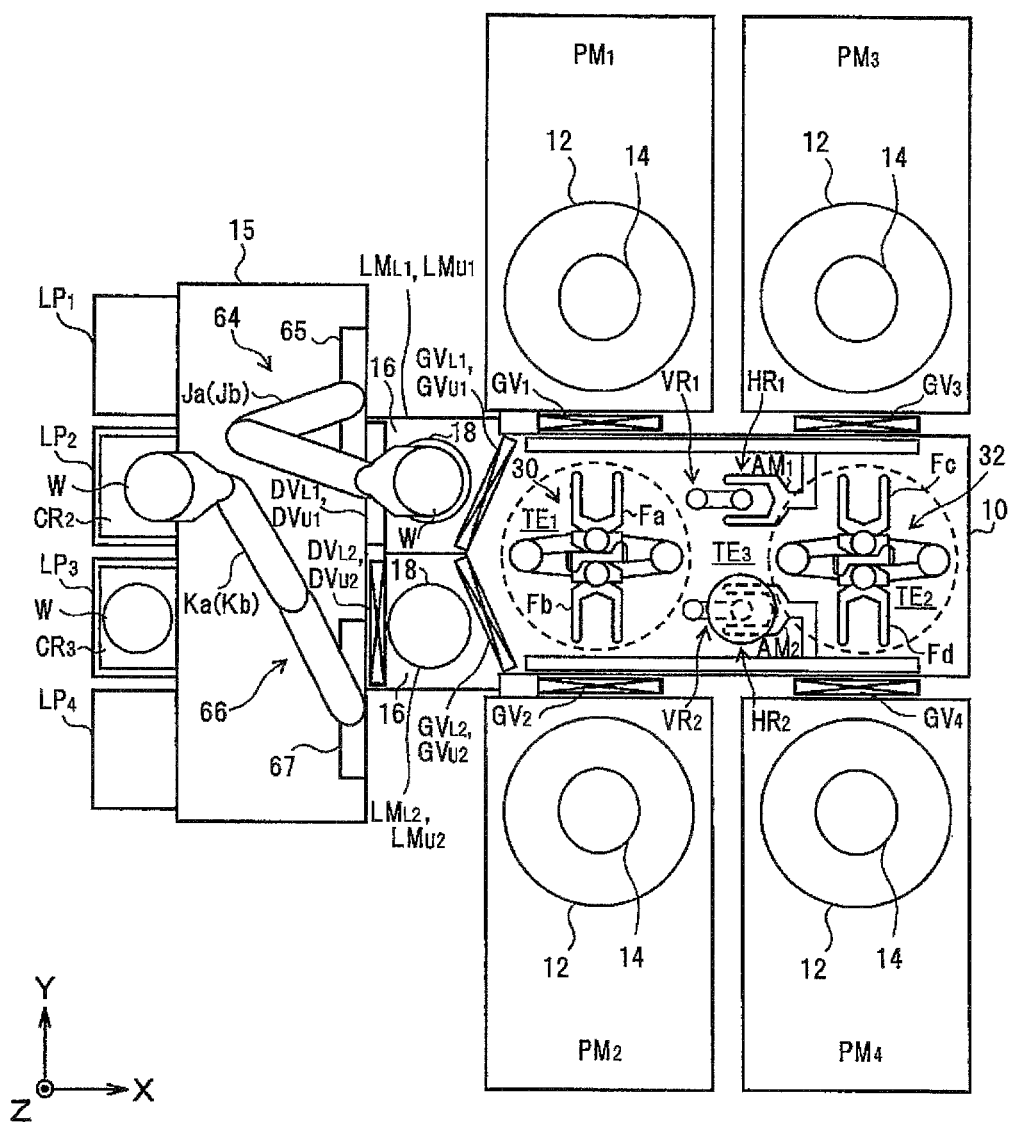
FIG. 1 is a plan view illustrating a vacuum processing apparatus according to an exemplary embodiment of the present invention.
Figure 2:
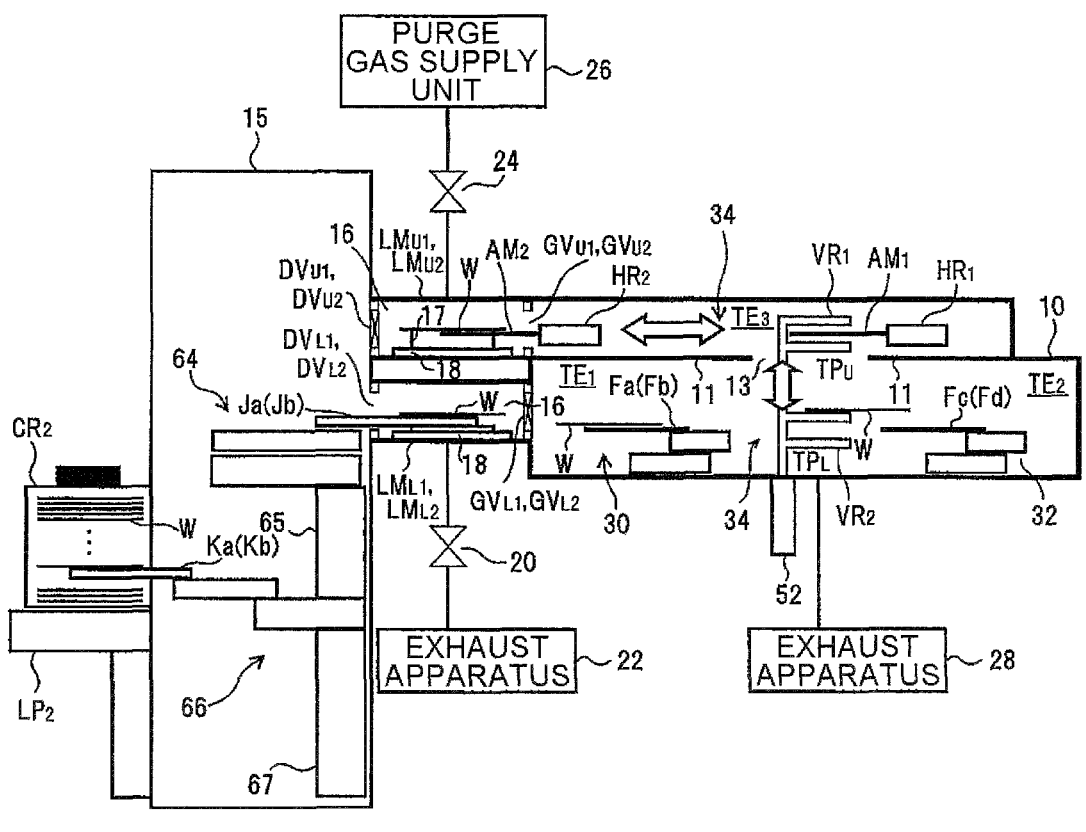
FIG. 2 is a longitudinal cross-sectional view illustrating the entire configuration of the vacuum processing apparatus.
Figure 3:
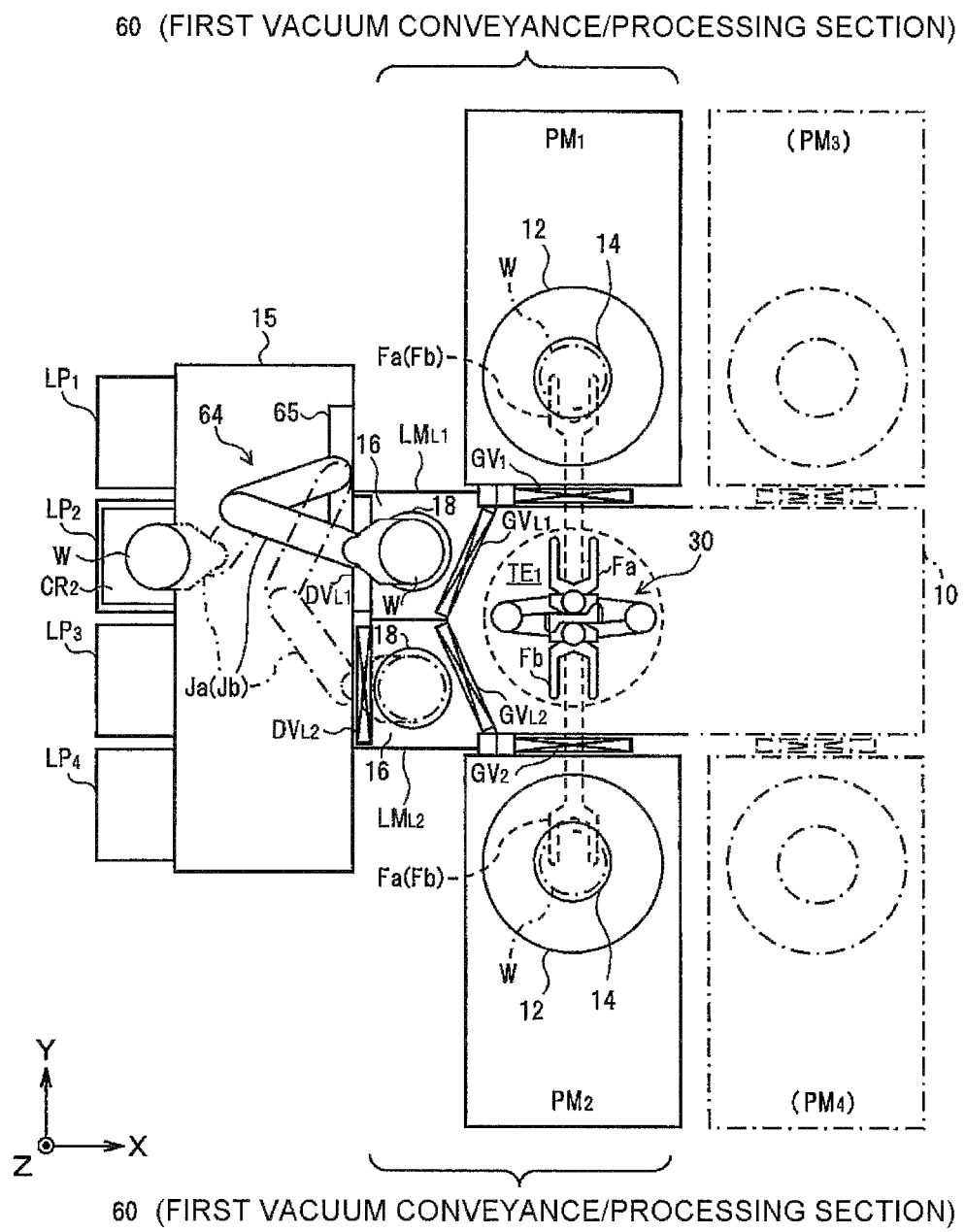
FIG. 3 is a plan view illustrating the first processing section in the vacuum processing apparatus.
Figure 4:
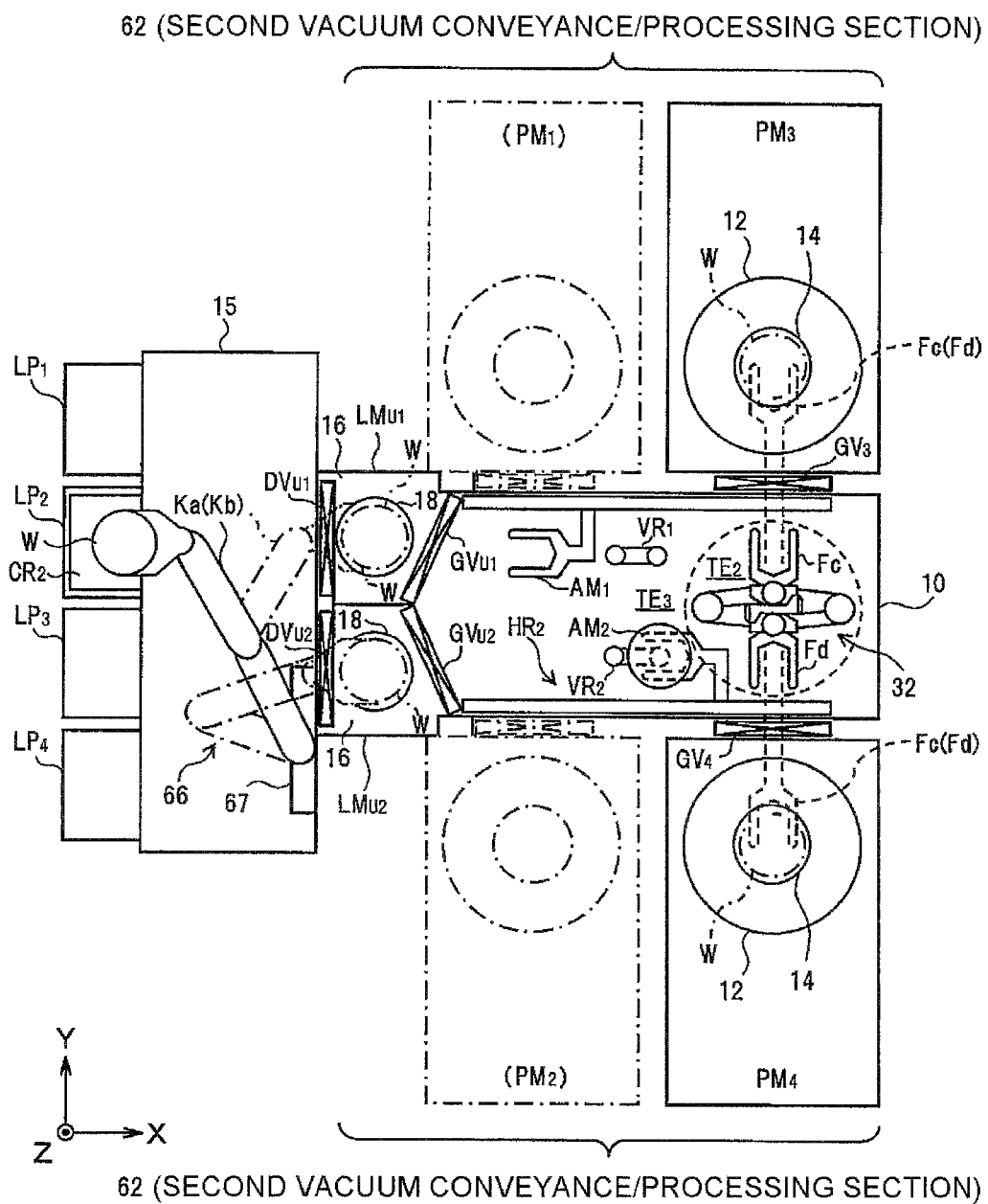
FIG. 4 is a plan view illustrating the second processing section in the vacuum processing apparatus.

FIGS. 1 and 2 illustrate the entire configuration of a vacuum processing apparatus according to an exemplary embodiment of the present invention as a horizontal cross-sectional view and a vertical cross-sectional view. FIGS. 3 and 4 illustrate the entire configuration by breaking it down into a first processing section and a second processing section which are operated in parallel.

The vacuum processing apparatus is configured as a cluster tool type plasma processing apparatus in which four process modules $PM_1$, $PM_2$, $PM_3$, $PM_4$ and four load-lock modules $LM_{L1}$, $LM_{L2}$, $LM_{U1}$, $LM_{U2}$ are arranged in a cluster type around a vacuum conveyance chamber 10 having a pentagonal shape in which the length of a pair of sides of the pentagonal shape extending in the depth direction of the apparatus (X-direction in the drawing) are about two times longer than the length of the other sides.

More particularly, the vacuum conveyance chamber 10 is formed in two floors in which, first and second vacuum conveyance areas $TE_1$, $TE_2$ separated from each other in the horizontal depth direction (X-direction) are formed in the first floor. In addition, around the first vacuum conveyance area $TE_1$, a first set of two load-lock modules $LM_{L1}$, $LM_{L2}$ are connected to two side walls of the inclined sides of the first vacuum conveyance area $TE_1$ through gate valves $GV_{L1}$, $GV_{L2}$, respectively, and a first set of two process module $PM_1$, $PM_2$ are connected to two side walls which are opposite and parallel to each other in the width direction (Y direction) through gate valves $GV_1$, $GV_2$, respectively. Meanwhile, around the second vacuum conveyance area $TE_2$, a second set of two process modules $PM_3$, $PM_4$ are connected to the two side walls which are opposite and parallel to each other in the width direction (Y-direction) through gate valves $GV_3$, $GV_4$, respectively.

The entirety of the second floor of the vacuum conveyance chamber 10 is a third vacuum conveyance area $TE_3$. The third vacuum conveyance area $TE_3$ is vertically spaced apart from the first and second vacuum conveyance areas $TE_1$, $TE_2$ of the first floor by a horizontal partition plate 11. However, the partition plate 11 is removed at the central portion thereof in the depth direction (X-direction) to form an aperture 13 and the third vacuum conveyance area $TE_3$ extends downwardly from the second floor to the first floor through the aperture 13 and enters between the first and second vacuum conveyance areas $TE_1$, $TE_2$.

Around the third vacuum conveyance area $TE_3$ of the second floor, a second set of two load-lock modules $LM_{U1}$, $LM_{U2}$ are connected to the two side walls of the two inclined sides, i.e. above the first load-lock modules $LM_{L1}$, $LM_{L2}$ of the first floor through gate valves $GV_{U1}$, $GV_{U2}$, respectively.

Each of the process modules (processing apparatuses) $PM_1$, $PM_2$, $PM_3$, $PM_4$ has a vacuum chamber 12 of which the interior is normally maintained at a reduced pressure state at a variable pressure by a dedicated exhaust apparatus (not illustrated) and is typically configured such that one or several processing-finished substrates, for example, semiconductor wafers W, are placed on a mounting table 14 arranged at the central portion of the interior of the vacuum chamber 12 and desired plasma processings such as, for example, a film-forming processing such as CVD, ALD (Atomic Layer Deposition) or sputtering, a heat treatment, a cleaning processing of a surface of a semiconductor wafer, and a dry etching processing are performed using predetermined available resources (e.g., processing gas and RF power).

The load-lock modules $LM_{L1}$, $LM_{L2}$, $LM_{U1}$, $LM_{U2}$ are configured to be also communicated with a loader module 15 through door valves $DV_{L1}$, $DV_{L2}$, $DV_{U1}$, $DV_{U2}$, respectively, and a mounting table 18 configured to temporarily hold a semiconductor wafer W transferred between the loader module 15 and the vacuum conveyance chamber 10 is provided in each of the load-lock chambers 16. As illustrated in FIG. 2, the load-lock chamber 16 of each of the load-lock modules $LM_{L1}$, $LM_{L2}$, $LM_{U1}$, $LM_{U2}$ is connected to an exhaust apparatus 22 through an opening/closing valve 20 and connected to a purge gas supply unit 26 through an opening/closing valve 24 so that the interior atmosphere may be switched to any one of the reduced pressure state and the atmospheric pressure state. Meanwhile, for simplifying the illustration, only one opening/closing valve 20 for exhaust is illustrated for one of the load-lock modules $LM_{L1}$, $LM_{L2}$ of the first floor and only one opening/closing valve 24 for purging is illustrated for only one of the load-lock modules $LM_{U1}$, $LM_{U2}$ of the second floor.

The vacuum conveyance chamber 10 is connected to a dedicated exhaust apparatus 28 and its interior is normally maintained at a reduced pressure state at a constant pressure. In the interior, the first and second vacuum conveyance robots (vacuum conveyance mechanisms) 30, 32 are provided at the first and second vacuum conveyance areas $TE_1$, $TE_2$, respectively, and a third vacuum conveyance robot (vacuum conveyance mechanism) 34 is provided at the third vacuum conveyance area $TE_3$.

The first vacuum conveyance robot 30 includes a body installed at the central portion of the first vacuum conveyance area $TE_1$, and a pair of conveyance arms $F_a$, $F_b$ which are rotatable, movable up and down, and movable back and forth (or retractable), in which each of the conveyance arms $F_a$, $F_b$ is configured to hold or support one semiconductor wafer W horizontally using a fork-type end-effector. In addition, the first vacuum conveyance robot 30 is configured to be accessible to any of the first set of process modules $PM_1$, $PM_2$ and the first set of load-lock modules $LM_{L1}$, $LM_{L2}$ arranged around the first vacuum conveyance area $TE_1$ and to be capable of selectively inserting any one of the conveyance arms $F_a$, $F_b$ into the chamber 12(16) of the access place through an opened gate valve (GV) $GV_1$, $GV_2$, $GV_{L1}$, $GV_{L2}$ so as to carry-in (load) a pre-treated semiconductor wafer W onto the mounting table 14(18) or carry-out (unload) a post-treated semiconductor wafer W from the mounting table 14(18).

The second vacuum conveyance robot 32 includes: a body installed at the central portion of the second vacuum conveyance area $TE_2$; and a pair of conveyance arms $F_c$, $F_d$ which are rotatable, movable up and down, and movable back and forth (or retractable). Each of the conveyance arms $F_c$, $F_d$ is configured to hold or support one semiconductor wafer W horizontally using a fork-type end-effector. In addition, the second vacuum conveyance robot 32 is configured to be accessible to any of the second set of process modules $PM_3$, $PM_4$ arranged around the second vacuum conveyance area $TE_2$ and to be capable of selectively inserting any one of the conveyance arms $F_c$, $F_d$ into the chamber 12 of the access place through an opened gate valve (GV) $GV_3$, $GV_4$ so as to carry-in (load) a pre-treated semiconductor wafer W onto the mounting table 14 or carry-out (unload) a post-treated semiconductor wafer W from the mounting table 14. In addition, as described below, the second vacuum conveyance robot 32 is configured to give and take a wafer W at the first floor portion of the second vacuum conveyance area $TE_2$.

The third vacuum conveyance robot 34 includes left and right side horizontal conveyance units $HR_1$, $HR_2$ which are movable rectilinearly in the depth direction (X-direction) at the second floor portion of the third vacuum conveyance area $TE_3$, and left and right side vertical conveyance units $VR_1$, $VR_2$ which are movable rectilinearly in the vertical direction (Z-direction), i.e. movable up and down in the aperture 13 of the third vacuum conveyance area $TE_3$. Here, the left and right side horizontal conveyance units $HR_1$, $HR_2$ and left and right side vertical conveyance units $VR_1$, $VR_2$ are arranged in parallel to each other at left and right in the width direction (Y-direction) to respectively correspond to a pair of left and right side load-lock modules $LM_{U1}$, $LM_{U2}$ arranged in parallel to each other in the width direction Y-direction in the second floor. That is, when viewed from the loader module 15 toward the depth direction (X-direction) of the vacuum conveyance chamber 10, the left side load-lock module $LM_{U1}$, the left side horizontal conveyance unit $HR_1$, and the left side vertical conveyance unit $VR_1$ are installed at the left half portion of the third vacuum conveyance area $TE_3$, and the right side load-lock module $LM_{U2}$, the right side horizontal conveyance unit $HR_2$, and the right side vertical conveyance unit $VR_2$ are installed at the right half portion of the third vacuum conveyance area $TE_3$.

[Specific Example of Configuration of Third Vacuum Conveyance Robot]

Figure 5:
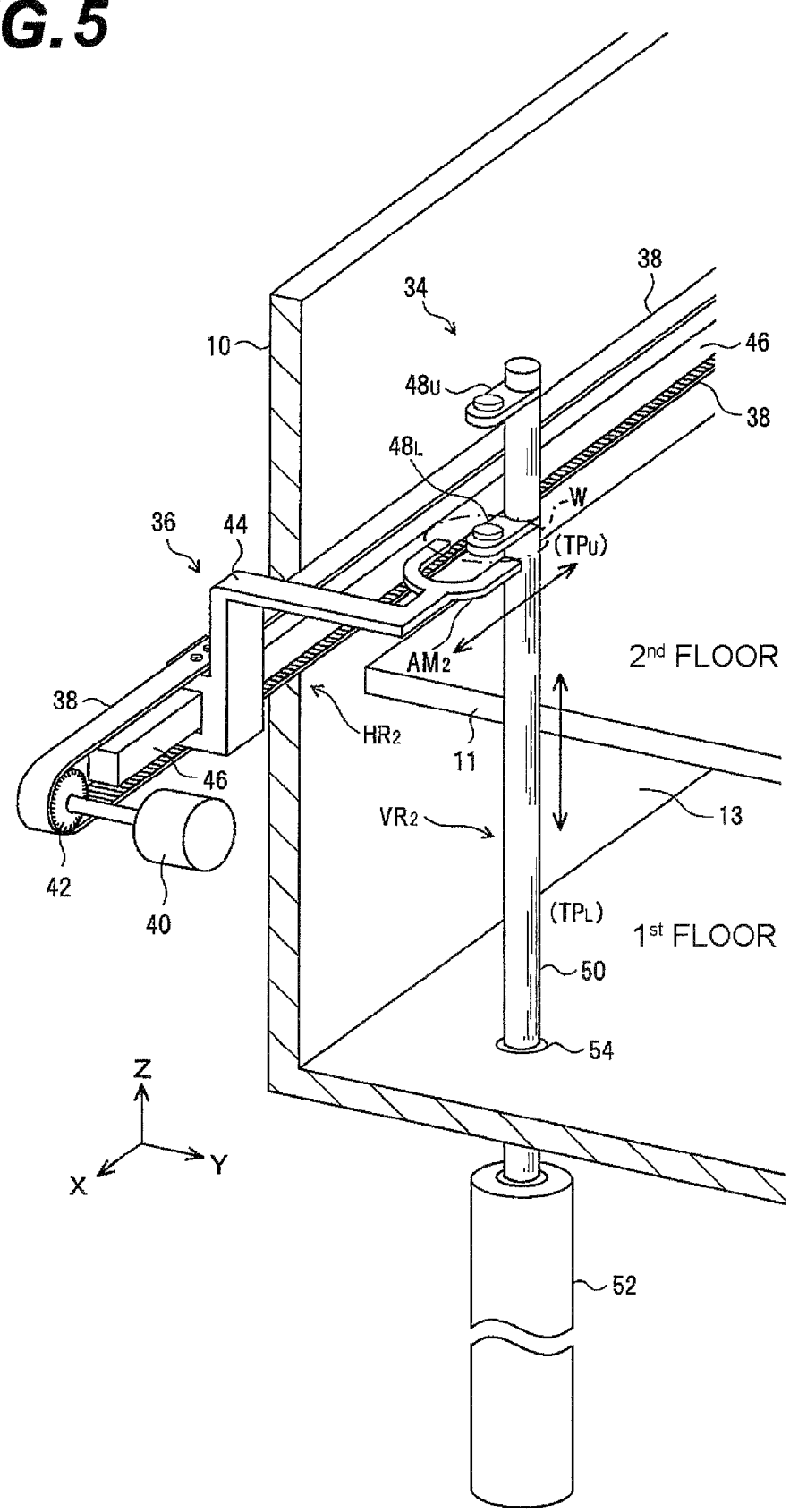
FIG. 5 is a perspective view illustrating a specific example of configuring the horizontal conveyance unit and the vertical conveyance unit of the third vacuum conveyance robot in the vacuum processing apparatus.

FIG. 5 illustrates a specific example of configuring the right side horizontal conveyance unit $HR_2$ and the right side vertical conveyance unit $VR_2$ of the third vacuum conveyance robot 34 operated at the right half portion of the third vacuum conveyance area $TE_3$.

The right side horizontal conveyance unit $HR_2$ includes: one fork-type conveyance arm $AM_2$ configured to be capable of holding or supporting one semiconductor wafer W toward the right side load-lock module $LM_{U2}$; and a horizontal rectilinear conveyance unit 36 configured to rectilinearly move the conveyance arm $AM_2$ only in the depth direction (X-direction) of the vacuum conveyance chamber 10. Here, the horizontal rectilinear conveyance unit 36 includes: an endless conveyance driving belt, for example, a timing belt 38 extending in the depth direction (X-direction) along the right side wall (or top wall) of the second floor portion of the vacuum conveyance chamber; a driving unit (motor 40, a driving pulley 42 and a floating pulley (not illustrated) in the opposite side) configured to drive the conveyance driving belt 38; an bracket-type arm support unit 44 configured to engage the conveyance arm $AM_2$ with the conveyance driving belt 38; and a rail 46 configured to guide the arm support unit 44 in the depth direction (X-direction). By controlling the start, rotating direction, rotating speed and stop of the motor 40, the conveyance arm $AM_2$ may be rectilinearly moved bi-laterally in the right half portion of the second floor portion of the third vacuum conveyance area $TE_3$ and stopped at an arbitrary location.

The right side vertical conveyance unit $VR_2$ includes: pad-type upper and lower buffers $48_U$, $48_L$ configured to carry or support one semiconductor wafer W horizontally at different heights with their backs oriented toward the load-lock module $LM_{U2}$ side; and a lifting driving unit 52 configured to move both of the buffers $48_U$, $48_L$ up and down between a first floor transfer position (first transfer position) $TP_L$ and a second floor transfer position (second transfer position) $TP_U$ which are formed at the first floor portion and the second floor portion of the aperture 13 of the vacuum conveyance area $TE_3$ through a lifting rod 50, respectively. The lifting driving unit 52 is configured by, for example, a linear motor, a ball-screw mechanism, or a cylinder. The lifting rod 50 extends to be slidable vertically through a hole formed in the bottom wall of the first floor of the vacuum conveyance chamber 10 via a seal member 54. By controlling the start, lifting direction, stroke and stop of the lifting driving unit 52, both of the buffers $48_U$, $48_L$ may be lifted in the aperture 13 of the third vacuum conveyance area $TE_3$ so that the vertical positions of the buffers $48_U$, $48_L$ may be arbitrarily changed.

Meanwhile, although, in FIG. 5, the upper and lower buffers $48_U$, $48_L$ are configured to support the semiconductor wafers W at one location, they may be configured to support the semiconductors W at various locations (for example, three pins arranged at a 120° interval in the circumferential direction).

The right side horizontal conveyance unit $HR_2$ is configured to be capable of giving and taking a semiconductor wafer W with the right side load-lock module $LM_{U2}$ within the load-lock chamber 16 and also giving and taking a semiconductor wafer W with both of the buffers $48_U$, $48_L$ of the right side vertical conveyance unit $VR_2$ at the second floor transfer position $TP_U$ by moving the conveyance arm $AM_2$ in the depth direction (X-direction) in the right half portion of the second floor portion of the third vacuum conveyance area $TE_3$.

More particularly, in the right side load-lock module $LM_{U2}$, by linking the moving-up and moving-down of a lift pin 17 to be described later and the entry and exit of the conveyance arm $AM_2$, a non-processed semiconductor W may be carried out from the load-lock chamber 16 or a processing-finished semiconductor W may be carried into the load-lock chamber.

In addition, when the non-processed semiconductor wafer W carried out from the right side load-lock module $LM_{U2}$ is delivered from the right side horizontal conveyance unit $HR_2$ to the right side vertical conveyance unit $VR_2$, the conveyance arm $AM_2$ is firstly retracted to an inner location over the second floor transfer position $TP_U$, and then, the right side conveyance unit $VR_2$ is moved up from the first floor to the second floor. At this time, the receiving side of the two buffers $48_U$, $48_L$, e.g. the buffer $48_U$ is aligned at a location somewhat lower than the conveyance arm $AM_2$. Subsequently, the conveyance arm $AM_2$ is moved forth to put out the semiconductor wafer W above the buffer $48_U$. Then, when the right side vertical conveyance unit $VR_2$ is moved up with a short stroke, the semiconductor wafer W is shifted from the conveyance arm $AM_2$ to the buffer $48_U$. Then, the conveyance arm $AM_2$ is retracted first and the vertical conveyance unit $VR_2$ is moved down from the second floor to the first floor.

In addition, when the right side horizontal conveyance unit $HR_2$ receives the processing-finished semiconductor W from the right side vertical conveyance unit $VR_2$, the conveyance arm $AM_2$ is also retracted to an inner location than the second floor transfer position $TP_U$, and then the right side vertical conveyance unit $VR_2$ is moved up from the first floor to the second floor. At this time, the processing-finished semiconductor wafer W carrying side of the two buffers $48_U$, $48_L$, for example, the buffer $48_L$ aligned at a location somewhat higher than the conveyance arm $AM_2$. Subsequently, when the conveyance arm $AM_2$ is moved forth to the underside of the buffer $48_L$ and the right side vertical conveyance unit $VR_2$ is moved down with a short stroke, the semiconductor wafer W is shifted from the buffer $48_L$ to the conveyance arm $AM_2$. Then, the conveyance arm $AM_2$ is retracted first and the right side vertical conveyance unit $VR_2$ is moved down from the second floor to the first floor.

As described above, through the right side horizontal conveyance unit $HR_2$, the semiconductor wafers W may be transmitted bi-laterally one by one between the right side load-lock module $LM_{U2}$ and each of the buffers $48_U$, $48_L$ of the right side vertical conveyance unit $VR_2$. In addition, exchange of a non-processed semiconductor wafer W and a processing-finished semiconductor wafer W may be performed between the right side horizontal conveyance unit $HR_2$ and the two buffers $48_U$, $48_L$.

Meanwhile, as being moved down to the first floor, the two buffers $48_U$, $48_L$ of the right side vertical conveyance unit $VR_2$ may give and take semiconductor wafers W with the second vacuum conveyance robot 32 at the first floor transfer position location $TP_L$. That is, while the right side vertical conveyance unit $VR_2$ is being in contact with the first floor transfer position $TP_L$, the second vacuum conveyance robot 32 is accessible to any of the two buffers $48_U$, $48_L$ so that the second vacuum conveyance robot 32 may receive a non-processed semiconductor wafer $W_i$ from each of the buffers $48_U$, $48_L$ or deliver a processing-finished semiconductor wafer $W_j$ to each of the buffers $48_U$, $48_L$ using the conveyance arms $F_c$, $F_d$, and may exchange the non-processed semiconductor wafer $W_i$ and the processing-finished semiconductor wafer $W_j$ by a pick and place operation.

Meanwhile, in the present exemplary embodiment, basically, the horizontal back-and-forth movement of the conveyance arms $F_c$, $F_d$ in the second vacuum conveyance robot 32 and the up-and-down movement of the buffers $48_U$, $48_L$ in the right side vertical conveyance unit $VR_2$ are linked with each other so that the giving and taking of a wafer W may be performed therebetween. However, when giving and taking the semiconductor wafer W, the second vacuum conveyance robot 32 performs the up-and-down movement of the conveyance arms $F_c$, $F_d$ as well as the horizontal back-and-forth movement. Thus, the operation for moving the buffers $48_U$, $48_1$—, up and down at the right side vertical conveyance unit $VR_2$ side may not be required.

As described above, the third vacuum conveyance robot 34 is configured to be capable of transmitting semiconductor wafers W bi-laterally one by one between the right side load-lock module $LM_{U2}$ of the second floor and the second vacuum conveyance robot 32 of the first floor using the right side horizontal conveyance unit $HR_2$ and the right side vertical conveyance unit $VR_2$.

The left side horizontal conveyance unit $HR_1$ and the left side vertical conveyance unit $VR_1$ of the third vacuum conveyance robot 34 operated in the left half portion of the third vacuum conveyance area $TE_3$ also have the same configurations and functions as those of the right side horizontal conveyance unit $HR_2$ and the right side vertical conveyance unit $VR_2$. Accordingly, the third vacuum conveyance robot 34 is configured to be capable of transmitting semiconductor wafers W bi-laterally one by one between the left side load-lock module $LM_{U1}$ of the second floor and the second vacuum conveyance robot 32 of the first floor using the left side horizontal conveyance unit $HR_1$ and the left side vertical conveyance unit $VR_1$.

Meanwhile, as illustrated in FIG. 2, the second set (second floor) of load-lock modules $LM_{U1}$, $LM_{U2}$ are provided with a lift pin mechanism configured to move a plurality of lift pins 17 up and down (extended and retracted) so as to give and take a semiconductor wafer W with the conveyance arm $AM_2$ above the mounting table 18 at the time of loading/unloading. The first set (first floor) of load-lock modules $LM_{L1}$, $LM_{L2}$ and all the process modules $PM_1$, $PM_2$, $PM_3$, $PM_4$ are also provided with a lift pin mechanism of the same type.

In the vacuum processing system around the vacuum conveyance chamber 10, an independent vacuum conveyance/processing section 60 (FIG. 3) is configured by the first vacuum conveyance robot 30 and the first set of load-lock modules $LM_{L1}$, $LM_{U2}$ and the first set of process modules $PM_1$, $PM_2$ of the first floor to which the vacuum conveyance robot 30 is accessible. Meanwhile, an independent second vacuum conveyance/processing section 62 (FIG. 4) is configured by the second vacuum conveyance robot 32, the second set of process modules $PM_3$, $PM_4$ of the first floor to which the vacuum conveyance robot 32 is accessible, the third vacuum conveyance robot 34, and the second set of load-lock modules $LM_{U1}$, $LM_{U2}$ of the second floor to which the vacuum conveyance robot 34 is accessible. The first and second vacuum conveyance/processing sections 60, 62 may perform the same processes or different processes in parallel or simultaneously for the semiconductor wafers W loaded in the vacuum processing apparatus.

Meanwhile, the rectilinear conveyance unit 36 of the horizontal conveyance units $HR_1$, $HR_2$ uses a belt mechanism but may use other rectilinear driving mechanisms such as, for example, a ball-screw mechanism or a linear motor.

[Configuration of Atmosphere System]

The atmosphere system of the vacuum processing apparatus includes: a loader module 15 connected to the load-lock modules $LM_{L1}$, $LM_2$, $LM_{U1}$, $LM_{U2}$ through the door valve $DV_{L1}$, $DV_{L2}$, $DV_{U1}$, $DV_{U2}$; a plurality of (e.g., four) load ports $LP_1$, $LP_2$, $LP_3$, $LP_4$ provided at the front side of the loader module 15; and first and second atmosphere conveyance robots (atmosphere conveyance mechanisms) 64, 66 operated within the atmosphere conveyance chamber of the loader module 15.

The load ports $LP_1$, $LP_2$, $LP_3$, $LP_4$ are arranged in a row to face the load-lock modules $LM_{L1}$, $LM_{L2}$, $LM_{U1}$, $LM_{U2}$, and are used for loading and unloading a wafer cassette CR using an external conveyance vehicle. The wafer cassette CR may accommodate 25 semiconductor wafers W of a batch or a lot. Here, the wafer cassette CR is configured as a box or pod such as, for example, an SMIF (Standard Mechanical Interface) or a FOUP (Front Opening Unified Pod).

The first atmosphere conveyance robot 64 is configured as a vertical articulated robot which is not provided with a horizontal slide shaft. The first atmosphere conveyance robot 64 includes a body 65 which is liftable and provided, for example, near the left side of the left side door valves $DV_{L1}$, $DV_{U1}$ in the loader module 15 and a pair of arms $J_a$, $J_b$ (only one arm is illustrated) extending from the body 65 into the air to be rotated by a plurality of rotation shafts. Each of the arms $J_a$, $J_b$ is configured to be capable of holding or supporting one semiconductor wafer W with a fork-type end effector. In addition, the first atmosphere conveyance robot 64 is accessible to a wafer cassette CR laid on any of three load ports $LP_1$, $LP_2$, $LP_3$ except the right-most load port $LP_4$ and all the load-lock modules $LM_{L1}$, $LM_{L2}$, $LM_{U1}$, $LM_{U2}$, and may unload (carry-out)/load (carry-in) semiconductor wafers W one by one from/into the wafer cassette CR or the load-lock module LM of the access place and exchange a processing-finished wafer $W_j$ and a non-processed wafer $W_i$ during one access by a pick and place method.

The second atmosphere conveyance robot 66 is also configured as a vertical articulated robot which is not provided with a horizontal slide shaft. The second atmosphere conveyance robot 66 includes a body 67 which is liftable and provided, for example, near the right side of the right side door valves $DV_{L2}$, $DV_{U2}$ in the loader module 15, and a pair of arms $K_a$, $K_b$ (only one arm is illustrated) extending from the body 67 into the air to be rotated by a plurality of rotation shafts. Each of the arms $K_a$, $K_b$ is configured to be capable of holding or supporting one semiconductor wafer W with a fork-type end effector. In addition, the second atmosphere conveyance robot 66 is accessible to a wafer cassette CR laid on any of three load ports $LP_2$, $LP_3$, $LP_4$ except the left-most load port $LP_1$ and all the load-lock modules $LM_{L1}$, $LM_{L2}$, $LM_{U1}$, $LM_{U2}$, and may unload (carry-out)/load (carry-in) semiconductor wafers W one by one from/into the wafer cassette CR or the load-lock module LM of the access place and exchange a processing a processing-finished wafer $W_j$ and a non-processed wafer $W_i$ during one access by a pick and place method (a method in which the robot 66 receives a wafer from the counterpart and instead, delivers another wafer).

As described above, any of the first and second atmosphere conveyance robots 64, 66 is accessible to a cassette CR laid on any of the two central load ports $LP_2$, $LP_3$ so that they may separately unload or load a semiconductor wafer W at their own timing in such a manner that the hands or arms of both sides do not interfere (collide) with each other. In addition, the left-most load port $LP_1$ is dedicated to the first atmosphere conveyance robot 64 and the right-most load port $LP_4$ is dedicated to the second atmosphere conveyance robot 66.

In the present exemplary embodiment, an operation in which one of the first and second atmosphere conveyance robots 64, 66 accesses to a cassette CR on any of the central common load ports $LP_2$, $LP_3$ and an operation in which the other accesses to any of the load-lock modules $LM_{L1}$, $LM_{L2}$, $LM_{U1}$, $LM_{U2}$ are adapted to be capable of being executed simultaneously or in parallel. Thus, in order to assure that each handling and aim operation may be rapidly or safely performed, each of the atmosphere conveyance robots 64, 66 is configured by a vertical articulated robot which is not provided with a horizontal slide shaft, and as illustrated in FIG. 2, the load ports $LP_1$, $LP_2$, $LP_3$, $LP_4$ are installed at a location lower than the load-lock modules $LM_{L1}$, $LM_{L2}$.

Meanwhile, in a cluster tool, it is desirable to align an orientation flat or notch of a semiconductor wafer W to a predetermined position when the semiconductor W is introduced into a vacuum system from an atmosphere system. In the vacuum processing apparatus of the present exemplary embodiment, each of the load-lock modules $LM_{L1}$, $LM_{L2}$, $LM_{U1}$, $LM_{U2}$ is configured as an independent unit having an individual load-lock chamber 16. Thus, the vacuum processing apparatus has a margin on a space and hardware for mounting an orientation flat alignment mechanism. Although not illustrated, for example, when a spin chuck is attached to the mounting table 18 and an optical sensor for optically detecting a notch of a semiconductor wafer W in an azimuth direction is provided, each module (unit) may be equipped with an orientation flat orientation mechanism.

In the loader module of the present exemplary embodiment, the first and second atmosphere conveyance robots 64, 66 may alternately access to the cassettes CR, for which a lot-processing is being performed or started, on the common load ports $LP_2$, $LP_3$ and perform the unloading/loading of semiconductor wafers W rapidly and smoothly. Thus, the loader module of the present exemplary embodiment may considerably enhance the conveyance efficiency of the atmosphere system and cope with the high throughput of the vacuum system without any difficulty.

[Entire Operation of Apparatus in Exemplary Embodiment]

Here, an exemplary embodiment of the entire operation in the vacuum processing apparatus will be described with reference to FIGS. 6A and 6B. The cluster tool method in the present exemplary embodiment enables all the process modules $PM_1$, $PM_2$, $PM_3$, $PM_4$ to uniformly perform a plasma processing with the same condition for the semiconductor wafers W within the cassettes $CR_2$, $CR_3$ carried into the central load ports $LP_2$, $LP_3$, which are simultaneously accessible by a time sharing method, as objects to be processed, and may be suitably employed especially when a short time (e.g., not more than 30 sec) process is performed with a high throughput.

In the present exemplary embodiment, 25 wafers $W_1$ to $W_{25}$ of one lot are sequentially unloaded from, for example, the cassette $CR_2$ on the load port $LP_2$ one by one and evenly allocated to and carried into any of the process modules $PM_1$, $PM_2$, $PM_3$, $PM_4$, and processing-finished wafers are rapidly carried out from each of the process modules $PM_1$, $PM_2$, $PM_3$, $PM_4$ and returned to the cassette $CR_2$ one by one. In the loader module 15, the first atmosphere conveyance robot 64 is in charge of the first set (first floor) of load-lock modules $LM_{L1}$, $LM_{L2}$ only, and the second atmosphere conveyance robot 66 is in charge of the second set (second floor) of load-lock modules $LM_{U1}$, $LM_{U2}$ only.

Figure 6A:
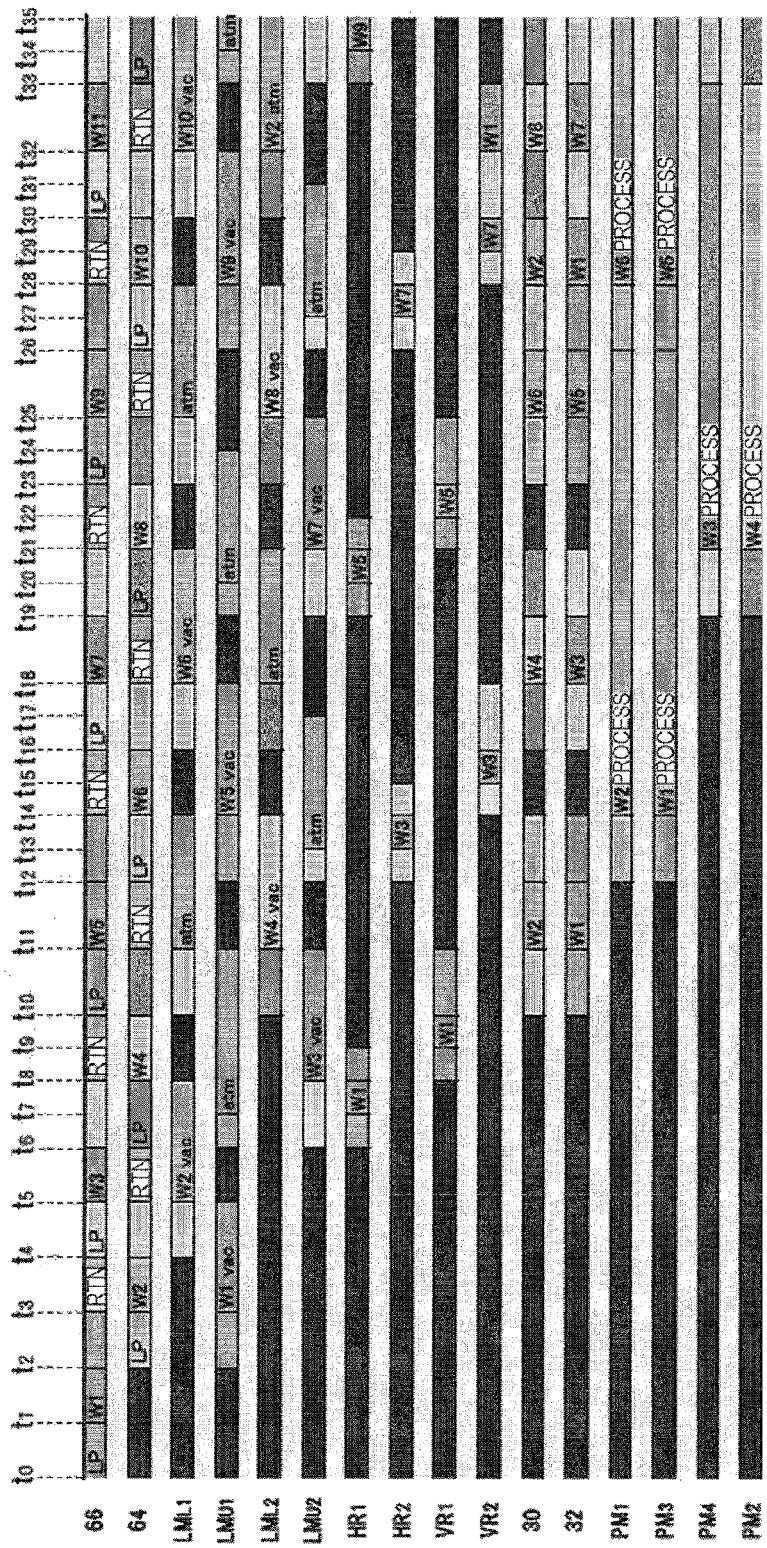
FIG. 6A is a timing diagram for describing an exemplary embodiment of the entire operation in the vacuum processing apparatus.

In FIGS. 6A and 6B, "66" and "64" denote the operating sequences of the atmosphere conveyance robots 66, 64, respectively. In the sequences, "LP" indicates an operation of moving the arms $J_a(J_b)$, $K_a(K_b)$ toward a load port LP (in the present examples, $LP_2$, $LP_3$), and "RTN" indicates an operation of retracting the arms $J_a(J_b)$, $K_a(K_b)$ from the load-lock chamber 16 of a load-lock module (LM) ($LM_{L1}$, $LM_{L2}$, $LM_{U1}$, $LM_{U2}$) and returning the arms to the original position thereof.

In addition, "$LM_{L1}$", "$LM_{U1}$", "$LM_{L2}$", "$LM_{U2}$" in the drawings indicate the operating sequences of the load-lock modules $LM_{L1}$, $LM_{U1}$, $LM_{L2}$, $LM_{U2}$, respectively. In the sequences, "vac" refers to vacuum evacuation of the load-lock chamber 16, and "atm" refers to purging or opening to atmosphere of the load-lock chamber 16.

Further, "$HR_1$", "$HR_2$", "$VR_1$", "$VR_2$" indicate the operating sequences of the left side horizontal conveyance unit $HR_1$, the right side horizontal conveyance unit $HR_2$, the left side vertical conveyance unit $VR_1$, and the right side vertical conveyance unit $VR_2$ of the third vacuum conveyance robot 34, respectively. "30" and "32" indicate the operating sequences of the first and second vacuum conveyance robots 30, 32, respectively. "$PM_1$", "$PM_3$", "$PM_4$", "$PM_2$" indicate the operating sequences of the process modules $PM_1$, $PM_3$, $PM_4$, $PM_2$, respectively.

In the present exemplary embodiment, the second atmosphere conveyance robot 66 moves to the cassette $CR_2$ on the load port $LP_2$ during the period of $t_0$ to $t_1$ using any one of the arms $K_a$, $K_b$, unloads the first wafer $W_1$ from the cassette $CR_2$ during the period of $t_1$ to $t_2$, and carries the wafer W1 into the left side load-lock module $LM_{U1}$ during the period of $t_2$ to $t_3$. In addition, the second atmosphere conveyance robot 66 returns the arm $K_a$, $K_b$ used at this time during the period of $t_3$ to $t_4$ from the standby position of the load-lock module $LM_{U1}$ to the original position of the arm. In the load-lock module $LM_{U1}$ into which the wafer $W_1$ is carried, vacuum evacuation is performed during the period of $t_3$ to $t_5$. Meanwhile, when the wafer W is carried into the load-lock module $LM_{U1}$ from the loader module 15 or the wafer W is carried out from the load-lock module $LM_{U1}$ to the loader module 15 to the contrary, the door valve $DV_{U1}$ is opened temporarily. Similarly, in the other load-lock modules $LM_{U2}$, $LM_{L1}$, $LM_{L2}$, when carrying-in/carrying-out of a wafer W is performed in relation to the loader module 15, the door valves $DV_{U2}$, $DV_{L1}$, $DV_{L2}$ are opened temporarily, respectively.

Meanwhile, the first atmosphere conveyance robot 64 moves to the cassette $CR_2$ during the period of $t_2$ to $t_3$, using any one of the arms $J_a$, $J_b$, unloads the second wafer $W_2$ from the cassette $CR_2$ during the period of $t_3$ to $t_4$, and carries the wafer 2 into the left side load-lock module $LM_{L1}$ of the first set (first floor) during the period of $t_4$ to $t_5$. Then, the first atmosphere conveyance robot 64 is returned from the standby position of the load-lock module $LM_{L1}$ to the original position of the arm during the period of $t_5$ to $t_6$. In the load-lock module $LM_{L1}$ into which the wafer $W_2$ is carried, vacuum evacuation is performed during the period of $t_5$ to $t_7$.

In addition, the second atmosphere conveyance robot 66 moves to the cassette $CR_2$ on the load port $LP_2$ during the period of $t_4$ to $t_5$ using any one of the arms $K_a$, $K_b$, unloads the third wafer $W_3$ from the cassette $CR_2$ during the period of $t_5$ to $t_6$, and carries the third wafer $W_3$ of the second set (second floor) into the right side load-lock module $LM_{U2}$ during the period of $t_6$ to $t_8$. In this manner, the second atmosphere conveyance robot 66 repeats the operation of allocating and transmitting the odd-numbered wafers $W_1$, $W_3$, $W_5$, $W_7$ . . . to any of the load-lock modules $LM_{U1}$, $LM_{U2}$ of the second set (second floor) from the cassette $CR_2$ in sequence one by one at constant cycles until the first processing-finished wafer $W_1$ is returned to the atmosphere system from the vacuum system as described later.

Meanwhile, the first atmosphere conveyance robot 64 moves to the cassette $CR_2$ on the load port $LP_2$ during the period of $t_5$ to $t_6$ using any one of the arms $J_a$, $J_b$, unload the fourth wafer $W_4$ from the cassette $CR_2$ during the period of $t_8$ to $t_{10}$, and carries the fourth wafer $W_4$ into the right side load-lock module $LM_{L2}$ of the first set (first floor) during the period of $t_{10}$ to $t_{11}$. In this manner, the first atmosphere conveyance robot 64 repeats the operation of allocating and transmitting the even-numbered wafers $W_2$, $W_4$, $W_6$, $W_8$ . . . to any of the load-lock modules $LM_{L1}$, $LM_{L2}$ of the first set (first floor) from the cassette $CR_2$ in sequence one by one at constant cycles until the second processing-finished wafer $W_2$ is returned to the atmosphere system from the vacuum system as described later.

In the left side load-lock module $LM_{U1}$ of the second set (second floor) where the first wafer $W_1$ is introduced and the vacuum evacuation is ended, the left side horizontal conveyance unit $HR_1$ of the third vacuum conveyance robot 34 carries out the wafer $W_1$ to the outside of the load-lock chamber 16, i.e., to the vacuum processing chamber 10 during the period of t6 to t7. Meanwhile, when a wafer W is carried out from the load-lock module $LM_{U1}$ into the vacuum processing chamber 10 or a wafer W is carried into the load-lock module $LM_{U1}$ from the vacuum chamber 10 to the contrary, the gate valve $GV_{U1}$ is temporarily opened. Similarly, when the carrying-in/carrying-out is performed between the other load-lock modules $LM_{U2}$, $LM_{L1}$, $LM_{L2}$ and the vacuum processing chamber 10, the gate valves $GV_{U2}$, $GV_{L1}$, $GV_{L2}$ are also temporarily opened, respectively.

The left side horizontal conveyance unit $HR_1$ moves rectilinearly along the left horizontal conveyance road of the second floor in a state where it holds the first wafer $W_1$ carried out from the load-lock module $LM_{U1}$, and delivers the wafer $W_1$ to the left side vertical conveyance unit $VR_1$ (any one of the buffers $48_U$, $48_L$) at the second flower transfer position $TP_U$ during the period of $t_8$ to $t_9$.

The left side vertical conveyance unit $VR_1$ which has received the first wafer $W_1$ immediately moves down to the first floor, and, during the period of $t_{10}$ to $t_{11}$, the left side vertical conveyance unit $VR_1$ delivers the wafer $W_1$ to the second vacuum conveyance robot 32 at the first floor transfer position $TP_L$. Upon receiving the first wafer $W_1$ using any one of the conveyance arms $F_c$, $F_d$ from the left side vertical conveyance unit $VR_1$, the second vacuum conveyance robot 32 rotates and, during the period of $t_{12}$ to $t_{14}$, carries the wafer $W_1$ into one process module $PM_3$ of the second set.

Meanwhile, in the left side load-lock module $LM_{L1}$ of the first set (first floor) in which vacuum evacuation has been ended in relation to the second wafer $W_2$, the first vacuum conveyance robot 30 carries out the second wafer $W_2$ from the load-lock chamber 16 using any one of the conveyance arm $F_a$, $F_b$ during the period of $t_{10}$ to $t_{11}$. Subsequently, the first vacuum conveyance robot 30 rotates and, during the period of $t_{12}$ to $t_{14}$, carries the wafer $W_2$ into one process module $PM_1$ of the first set.

By doing as described above, the first wafer $W_1$ is carried into one process module $PM_3$ of the second set and at the same time, the second wafer $W_2$ is carried into one process module $PM_1$ of the first set. Both the process modules $PM_3$, $PM_1$ perform a plasma processing for the wafers $W_1$, $W_2$ with the same process condition during the period $t_{14}$ to $t_{26}$.

Meanwhile, in the right side load-lock module $LM_{U2}$ of the second set (second floor) where the third wafer $W_3$ has been carried in and vacuum evacuation has been performed during the period of $t_8$ to $t_{11}$, the right side horizontal conveyance unit $HR_2$ of the third vacuum conveyance robot 34 carries out the wafer $W_3$ from the load-lock chamber 16 during the period of $t_{12}$ to $t_{13}$. The right side horizontal conveyance unit $HR_2$ moves horizontally and rectilinearly along the right side horizontal conveyance road of the second floor in the state in which it holds the third wafer $W_3$ carried out from the load-lock module $LM_{U2}$, and during the period $t_{14}$ to $t_{15}$, delivers the wafer $W_3$ to the right side vertical conveyance unit $VR_2$ (any one of the buffers $48_U$, $48_L$) at the second floor transfer position $TP_U$.

The right side vertical conveyance unit $VR_2$ that has received the third wafer $W_3$ immediately moves down to the first floor, and, during the period of $t_{16}$ to $t_{18}$, delivers the third wafer $W_3$ to the second vacuum conveyance robot 32 at the first floor transfer position $TP_L$. Upon receiving the wafer $W_3$ using any one of the conveyance arms $F_c$, $F_d$ from the right side vertical conveyance unit $VR_2$, the second vacuum conveyance robot 32 rotates and, during the period of $t_{19}$ to $t_{21}$, carries the wafer $W_3$ into the other process module $PM_4$ of the second set.

Meanwhile, in the right side load-lock module $LM_{L2}$ of the first set (first floor) in which the fourth wafer $W_4$ has been carried and vacuum evacuation has been performed during the period of $t_{11}$ to $t_{14}$, the first vacuum conveyance robot 30 unloads the wafer $W_4$ from the load-lock chamber 16 using any one of the conveyance arms $F_a$, $F_b$ during the period of $t_{16}$ to $t_{18}$. Subsequently, the first vacuum conveyance robot 30 rotates, and, during the period of $t_{19}$ to $t_{21}$, carries the wafer $W_4$ into the other process module $PM_2$ of the first set.

By doing as described above, the third wafer $W_3$ is carried into the other process module $PM_4$ of the second set and at the same time, the fourth wafer $W_4$ is carried into the other process module PM2 of the first set. Both the process modules $PM_4$, $PM_2$ perform a plasma processing with the same process condition for the wafers $W_3$, $W_4$ during the period of $t_{21}$ to $t_{33}$.

In the third vacuum conveyance robot 34, during the period of $t_{19}$ to $t_{25}$, the left side horizontal conveyance unit $HR_1$ and the left side vertical conveyance unit $VR_1$ repeat the operation which is completely the same as that performed to the first wafer $W_1$ to transmit the fifth wafer $W_5$ from the left side load-lock module $LM_{U1}$ of the second set (second floor) to the second vacuum conveyance robot 32. Upon receiving the fifth wafer $W_5$ from the right side left side vertical conveyance unit $VR_1$ using any one of the conveyance arms conveyance arms $F_c$, $F_d$, the second vacuum conveyance robot 32 rotates and, during the period of $t_{26}$ to $t_{28}$, accesses to one process module $PM_3$ of the second set, carries out the processing-finished first wafer W from the empty side of the conveyance arms $F_c$, $F_d$, and instead, carries the non-processed fifth wafer $W_5$ into the empty side.

Meanwhile, the first vacuum conveyance robot 30 carries out the sixth wafers W6 from the right side load-lock module $LM_{L2}$ of the first set (first floor), which has been vacuum-evacuated during the period of $t_{18}$ to $t_{21}$, using any one of the conveyance arms $F_a$, $F_b$ during the period of $t_{23}$ to $t_{25}$. Subsequently, the first vacuum conveyance robot 30 rotates, and during the period of $t_{26}$ to $t_{28}$, accesses to one process module $PM_1$ of the first set to carry out the second wafer $W_2$ from the empty side of the conveyance arms $F_a$, $F_b$ and instead, to carry the non-processed sixth wafer $W_6$ into the empty side.

By doing as described above, the fifth wafer $W_5$ is carried into the process module $PM_3$ of the second process module, and at the same time, the sixth wafer $W_6$ is carried into the process module $PM_1$ of the first set. Both the process modules $PM_3$, $PM_1$ perform a plasma processing with the same condition as those described above for the wafers wafer $W_5$, $W_6$ during the period of $t_{28}$ to $t_{41}$.

As described above, the second vacuum conveyance robot 32 accesses to the right side vertical conveyance unit $VR_2$ of the third vacuum conveyance robot 34 during the period of $t_{30}$ to $t_{32}$ just after carrying out the first wafer $W_1$ from the process module $PM_3$, delivers the processing-finished first wafer $W_1$ to any one of the right side vertical conveyance unit $VR_2$ (any one of the buffers 48U, 48L), and instead, receives the non-processed seventh wafer $W_7$ conveyed by the right side vertical conveyance unit $VR_2$.

Meanwhile, as described above, the first vacuum conveyance robot 30 accesses to the right side load-lock module $LM_{L2}$ of the first set (first floor) during the period of $t_{30}$ to $t_{32}$ just after the second wafer $W_2$ has been carried out from the process module $PM_1$ to carry out the non-processed eighth wafer $W_8$ from the load-lock chamber 16 and instead, to carry the processing finished second wafer $W_2$ into the load-rock chamber 16.

The load-lock module $LM_{L2}$ into which the second wafer $W_2$ has been carried is opened to the atmosphere during the period of $t_{32}$ to $t_{35}$. Then, the first atmosphere conveyance robot 64 accesses to the load-lock module $LM_{L2}$ during the period of $t_{37}$ to $t_{39}$ to carry out the processing-finished second wafer $W_2$ from the load-lock chamber 16 and instead, carries the twelfth wafer $W_{12}$ into the load-lock chamber 16.

The first atmosphere conveyance robot 64 which has carried out the processing-finished second wafer $W_2$ from the load-lock module $LM_{L2}$ moves to the standby position of the cassette $CR_2$ on the load port $LP_2$ during the period of $t_{39}$ to $t_{41}$ to return the wafer $W_2$ and to unload the non-processed fourteenth wafer $W_{14}$ during the period of $t_{41}$ to $t_{42}$.

Meanwhile, as described above, the third vacuum conveyance robot 34, which has received the processing-finished first wafer $W_1$ from the second vacuum conveyance robot 32 in the right side vertical conveyance unit $VR_2$ during the period of $t_{30}$ to $t_{32}$, shifts the wafer $W_1$ from the right side vertical conveyance unit $VR_2$ to the right side horizontal conveyance unit $HR_2$ during the period of $t_{41}$ to $t_{42}$ and carries the wafer $W_1$ into the right side load-lock module $LM_{U2}$ of the second set (second floor) during the period of $t_{43}$ to $t_{44}$.

The load-lock module $LM_{U2}$ into which the first wafer $W_1$ has been carried is opened to the atmosphere during the period of $t_{44}$ to $t_{47}$. Then, the second atmosphere conveyance robot 66 accesses to the load-lock module $LM_{U2}$ during the period of $t_{47}$ to $t_{48}$ to carry out the processing-finished first wafer $W_1$ from the load-lock chamber 16 and instead, to carry the non-processed fifteenth wafer $W_{15}$ into the load-lock chamber 16.

The second atmosphere conveyance robot 66 which has carried out the processing-finished first wafer $W_1$ from the load-lock module $LM_{U2}$ as described above moves to the standby position of the cassette $CR_2$ on the load port $LP_2$ during the period of $t_{48}$ to $t_{49}$ to return the wafer $W_1$, and unloads the non-processed seventeenth wafer $W_{17}$ during the period of $t_{50}$ to $t_{51}$.

Meanwhile, the second vacuum conveyance robot 32 accesses to the other process module $PM_4$ of the second set during the period of $t_{33}$ to $t_{35}$ to carry out the processing-finished third wafer $W_3$ and instead, to carry the non-processed seventh wafer $W_7$ into the other process module $PM_4$. In addition, the first vacuum conveyance robot 30 accesses to the other process module $PM_2$ of the first set during the period of $t_{33}$ to $t_{35}$ to carry out the processing-finished fourth wafer $W_4$ from the other process module $PM_2$, and instead, to carry the non-processed eighth wafer $W_8$ into the other process module $PM_2$.

The second vacuum conveyance robot 32 accesses to the left side vertical conveyance unit $VR_1$ of the third vacuum conveyance robot 34 during the period of $t_{37}$ to $t_{39}$ just after carrying out the third wafer $W_3$ from the process module $PM_4$ as described above to deliver the processing-finished third wafer $W_3$ to the left side vertical conveyance unit $VR_1$ (any one of the buffers 48U, 48L), and instead, to receive the non-processed ninth wafer $W_9$ conveyed by the left side vertical conveyance unit $VR_1$.

Meanwhile, the first vacuum conveyance robot 30 accesses to the left side load-lock module $LM_{L1}$ of the first set (first floor) during the period of $t_{37}$ to $t_{39}$ just after carrying out the fourth wafer $W_4$ from the process module $PM_2$ as described above to carry out the non-processed tenth wafer $W_{10}$ from the load-lock chamber 16, and instead, to carry the processing-finished fourth wafer $W_4$ into the load-lock chamber 16.

The load-lock module $LM_{L1}$ into which the fourth wafer $W_4$ has been carried is opened to the atmosphere during the period of $t_{39}$ to $t_{42}$. Then, the first atmosphere conveyance robot 64 accesses to the load-lock module $LM_{L1}$ during the period of $t_{44}$ to $t_{45}$ to carry out the processing-finished fourth wafer $W_4$ from the load-lock chamber 16, and instead, to carry the non-processed fourteenth wafer $W_{14}$ into the load-lock chamber 16.

The first atmosphere conveyance robot 64 which has carried out the processing-finished fourth wafer $W_4$ from the load-lock module $LM_{L1}$ in this manner moves to the standby position of the cassette $CR_2$ on the load port $LP_2$ during the period of $t_{45}$ to $t_{47}$ to return the wafer $W_4$ and to unload the non-processed sixteenth wafer $W_{16}$ during the period of $t_{47}$ to $t_{48}$.

Meanwhile, the third vacuum conveyance robot 34 which has received the processing-finished third wafer $W_3$ from the second vacuum conveyance robot 32 during the period of $t_{37}$ to $t_{39}$ as described above shifts the wafer $W_3$ from the left side vertical conveyance unit $VR_1$ to the left side horizontal conveyance unit $HR_1$ during the period of $t_{47}$ to $t_{48}$ and carries the wafer $W_3$ into the left side load-lock module $LM_{U1}$ of the second set (second floor) during the period of $t_{48}$ to $t_{49}$.

The load-lock module $LM_{U1}$ into which the third wafer $W_3$ has been carried is opened to the atmosphere during the period of $t_{49}$ to $t_{52}$. Then, the second atmosphere conveyance robot 66 accesses to the load-lock module $LM_{U1}$ during the period of $t_{52}$ to $t_{53}$ to carry out the processing-finished third wafer $W_3$ from the load-lock chamber 16, and instead, carries the non-processed seventh wafer $W_{17}$ into the load-lock chamber 16.

The second atmosphere conveyance robot 66 which has carried out the processing-finished third wafer $W_3$ from the load-lock module $LM_{U1}$ as described above moves to the standby position of the cassette $CR_2$ on the load port $LP_2$ during the period of $t_{54}$ to $t_{55}$ to return the wafer $W_3$, and unloads the non-processed nineteenth wafer $W_{19}$ during the period of $t_{55}$ to $t_{56}$.

Thereafter, the operations as described above are repeated in each section. Then, when the first lot processing for the cassette $CR_2$ on the load port $LP_2$ is ended, the processing of one lot as described above is also repeated for the cassette $CR_3$ on the neighboring load port $LP_3$. In this manner, the processing of one lot is continuously and alternately repeated for the cassettes $CR_2$, $CR_3$ on the two load ports $LP_2$, $LP_3$.

As illustrated in FIGS. 6A and 6B, in the present exemplary embodiment, all the vacuum conveyance robots 30, 32, 34, all the atmosphere conveyance robots 64, 66, all the load-lock modules $LM_{L1}$, $LM_{L2}$, $LM_{U1}$, $LM_{U2}$, and all the process modules $PM_1$, $PM_2$, $PM_3$, $PM_4$ are fully operated with a high efficiency substantially without a standby time or with a minimum standby time. In particular, since the first vacuum conveyance/processing section 60 and the second vacuum conveyance/processing section 62 are operated independently from each other, the first vacuum conveyance robot 30 may only perform the conveyance of wafers within the first vacuum conveyance/processing section 60 without needing to engage in (relay) the conveyance of wafers between the second set (second floor) of load-lock modules $LM_{U1}$, $LM_{U2}$ and the second set of process modules $PM_3$, $PM_4$. Accordingly, the conveyance load is not concentrated to the first vacuum conveyance robot 30. Thus, since the conveyance load is correspondingly distributed over all the vacuum conveyance robots 30, 32, 34, the conveyance performance and conveyance efficiency of the entire system are high and thus, the throughput of a short time process in a cluster tool may be greatly enhanced.

Other Exemplary Embodiment or Modified Embodiment

In the above-described exemplary embodiment, all the process modules $PM_1$, $PM_2$, $PM_3$, $PM_4$ are made to entirely uniformly perform the same process in parallel. In another exemplary embodiment, a parallel processing may also be performed in which the first vacuum conveyance/processing section 60 sequentially conveys one semiconductor wafer $W_i$ to the process modules $PM_1$, $PM_2$ so that two types or two steps of processes are continuously performed and the second vacuum conveyance/processing section 62 sequentially conveys another semiconductor wafer $W_j$ to the process modules $PM_3$, $PM_4$ so that two types or two steps of processes are continuously performed with the same process conditions.

In addition, the number of process modules included in each of the vacuum conveyance/processing sections 60, 62 is optional and, for example, three or more process modules may be included. Further, the bodies of the first and/or second vacuum conveyance robots 30, 32 may also be configured such that the bodies may move in a predetermined direction or an arbitrary direction within the first and/or second vacuum conveyance areas $TE_1$, $TE_2$.

In the above-described exemplary embodiment, each of the load-lock modules $LM_{L1}$, $LM_{L2}$, $LM_{U1}$, $LM_{U2}$ accommodates the semiconductor wafers W in the load-lock module on a single wafer basis. Accordingly, the interior of the load-lock module may be compactly configured and an air intake/exhaust operation or a cooling operation may be performed frequently on a single wafer basis and within a short time. However, it is also possible to configure such that plural semiconductor wafers W may be simultaneously accommodated within the load-lock module as needed.

Furthermore, the vacuum conveyance chamber 10 may be further extended in the depth direction to form another (fourth) vacuum conveyance area (not illustrated) in the first flower portion thereof so that a fourth conveyance robot may be arranged in the fourth vacuum conveyance robot within the fourth vacuum conveyance area and a third set of process modules are arranged around the fourth vacuum robot. In such a case, the vacuum conveyance chamber 10 is formed in three floors and a pair of load-lock modules of a third set (third floor) are provided above the second set (second floor) of load-lock modules $LM_{U1}$, $LM_{U2}$. In addition, a fifth vacuum conveyance robot is provided in which the fifth vacuum conveyance has the same configuration as the third vacuum conveyance robot 34 and moves between the third floor and the first floor to transmit semiconductor wafers W one by one between the third set (third floor) of load-lock modules and the fourth vacuum conveyance robot. Meanwhile, a configuration provided with only one load-lock module in each floor or a configuration provided three or more load-lock modules may also be employed.

In addition, in the above-described exemplary embodiment, due to the configuration of the vertical conveyance unit $VR_1(VR_2)$ in which a pair of buffers $48_U$, $48_L$ are provided in the third vacuum conveyance robot 34, a non-processed semiconductor wafer W, and a processing-finished semiconductor wafer $W_j$ may be exchanged between the vertical conveyance unit $VR_1(VR_2)$ and the horizontal conveyance unit $HR_1(HR_2)$.

Figure 7:
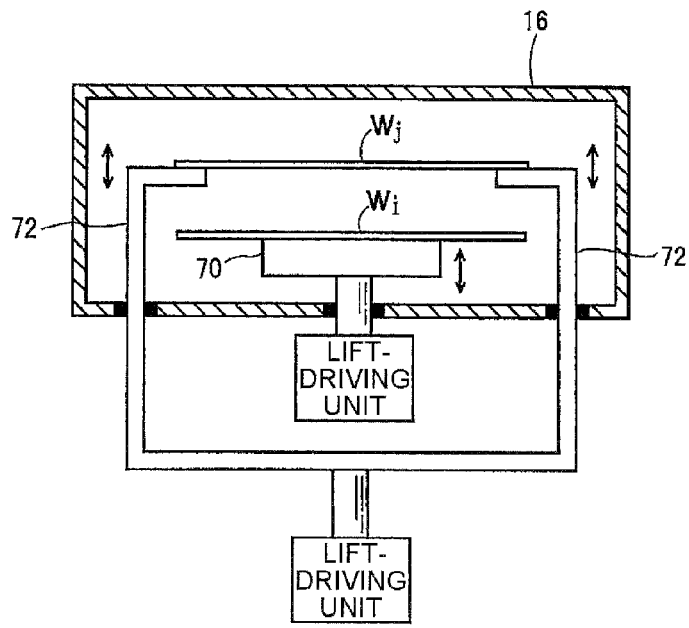
FIG. 7 is a schematic longitudinal cross-sectional view illustrating a modified embodiment in the vacuum processing apparatus.

However, as a modified embodiment, a configuration provided with only one vertical conveyance unit $VR_1(VR_2)$ may be employed. In such a case, the second vacuum conveyance robot 32 may receive a non-processed semiconductor wafer $W_i$ from the buffer 48 of the vertical conveyance unit $VR_1(VR_2)$ using a pair of conveyance arm $F_c$, $F_d$ by a pick and place method, and instead, deliver a processing-finished semiconductor wafer $W_j$. However, the exchange of the semiconductor wafers $W_i$, $W_j$ may not be performed between the horizontal conveyance unit $HR_1$ ($HR_2$) and the vertical conveyance unit $VR_1(VR_2)$. Thus, as illustrated in FIG. 7, two wafer support units 70, 72, each of which may support one wafer W loaded thereon and may be independently movable up and down, is provided within the load-lock chamber 16 of each load-lock module LM. In such a case, the horizontal conveyance unit $HR_1(HR_2)$ may load a processing-finished semiconductor wafer $W_j$ conveyed by one arm $AM_1(AM_2)$ on one of the wafer support units, for example, the upper wafer support unit 72 and then retract the arm $AM_1(AM_2)$ first. Immediately thereafter, within the load-lock chamber 16, the upper wafer support unit 72 is retracted upwardly so that the lower wafer support unit 70 which supports the non-processed semiconductor wafer $W_i$ is aligned to the height of the arm $AM_1(AM_2)$. Then, the horizontal conveyance unit $HR_1(HR_2)$ introduces or puts an empty arm $AM_1(AM_2)$ into the load-lock chamber 16, receives the non-processed semiconductor wafer $W_i$ from the lower wafer support unit 70, and then, retracts the arm $AM_1(AM_2)$.

In the above-described exemplary embodiment, an orientation flat alignment mechanism is incorporated in each of the load-lock modules $LM_{L1}$, $LM_{L2}$, $LM_{U1}$, $LM_{U2}$. However, it is also possible to provide respective dedicated orientation flat alignment mechanisms or a common orientation flat alignment mechanism within the atmosphere conveyance chamber of the loader module 15 at a position(s) where the atmosphere conveyance robots 64, 66 are accessible.

In the above-described exemplary embodiment, the second set (second floor) of load-lock modules $LM_{U1}$, $LM_{U2}$ are arranged above the first set (first floor) of load-lock modules $LM_{L1}$, $LM_{L2}$. In a modified embodiment, the second set (second floor) of load-lock modules $LM_{U1}$, $LM_{U2}$ may also be arranged above the first vacuum conveyance area $TE_1$, as illustrated in FIG. 8.

In such a case, the arms $J_a(J_b)$, $K_a(K_b)$ of the atmosphere conveyance robots 64, 66 access to the load-lock modules $LM_{U1}$, $LM_{U2}$ of the second set (second floor) from the loader module 15 side, passing over the first set (first floor) of load-lock modules $LM_{L1}$, $LM_{L2}$. In the vacuum conveyance chamber 10, the third vacuum conveyance area $TE_3$ is reduced by the volume of the load-lock modules $LM_{L1}$, $LM_{L2}$ in the second floor. Thus, the size in the depth direction (X-direction) is greatly reduced. Accordingly, the conveyance distance or conveyance time of the horizontal conveyance units $HR_1$, $HR_2$ of the third vacuum conveyance robot 34 are reduced.

Further, since, in the first set (first floor) of load-lock modules $LM_{L1}$, $LM_{L2}$ as well as the second set (second floor) of the load-lock modules $LM_{U1}$, $LM_{U2}$, the top plates thereof may be optionally detached, the maintenanceability may be improved. In addition, an openable/closable hatch (not illustrated) may be attached to each of the bottom and top plates of the third vacuum conveyance area $TE_3$ at the position of the aperture 13. When the maintenance of the interior of the vacuum conveyance chamber 10 is performed in a state where the vacuum conveyance chamber 10 is opened to the atmosphere, an operator may open the hatch and enter through the aperture 13 to perform, for example, replacement of parts or cleaning within each of the vacuum conveyance areas $TE_1$, $TE_2$, $TE_3$.

Figure 8:
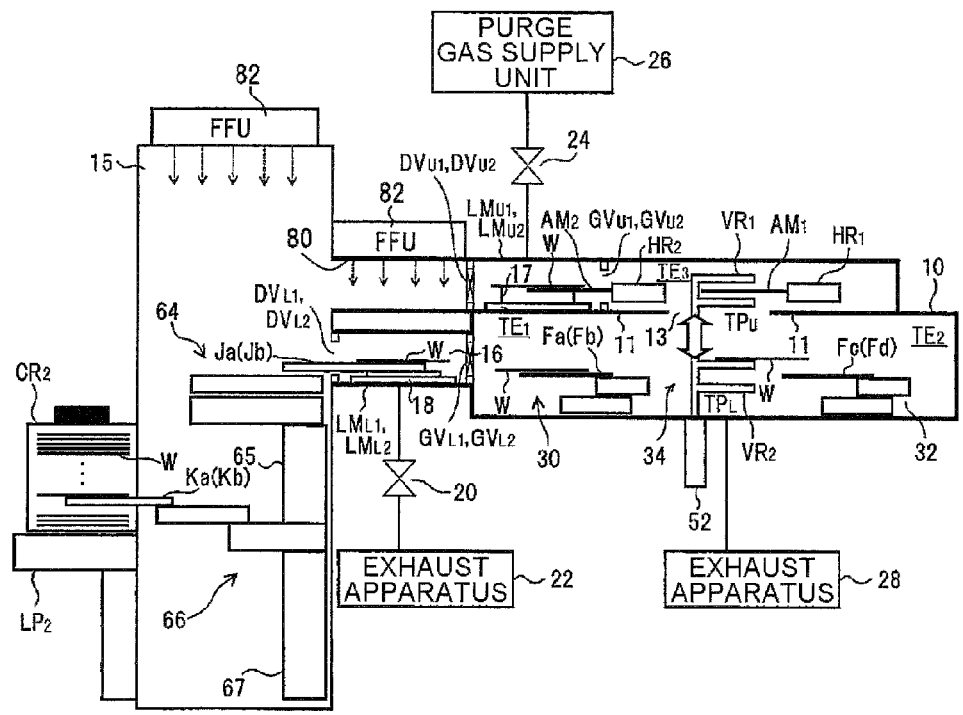
FIG. 8 is a longitudinal cross-sectional view of a modified embodiment of the vacuum processing apparatus.

Meanwhile, in the atmosphere system, an extension ceiling part (or a separate dustproof wall or a dust proof cover) 80 of the loader module 15 may be preferably installed on the front side conveyance area of the second set (second floor) of load-lock modules $LM_{U1}$, $LM_{U2}$, i.e., above the first set (first floor) of load-lock modules $LM_{L1}$, $LM_{L2}$, as illustrated in FIG. 8. In addition, when an air cleaning device, for example, a fan filter unit (FFU) 82 is installed on the ceiling of the loader module 15, it is desirable to provide an FFU 82 on the extension ceiling part 80 as well.

Figure 9:
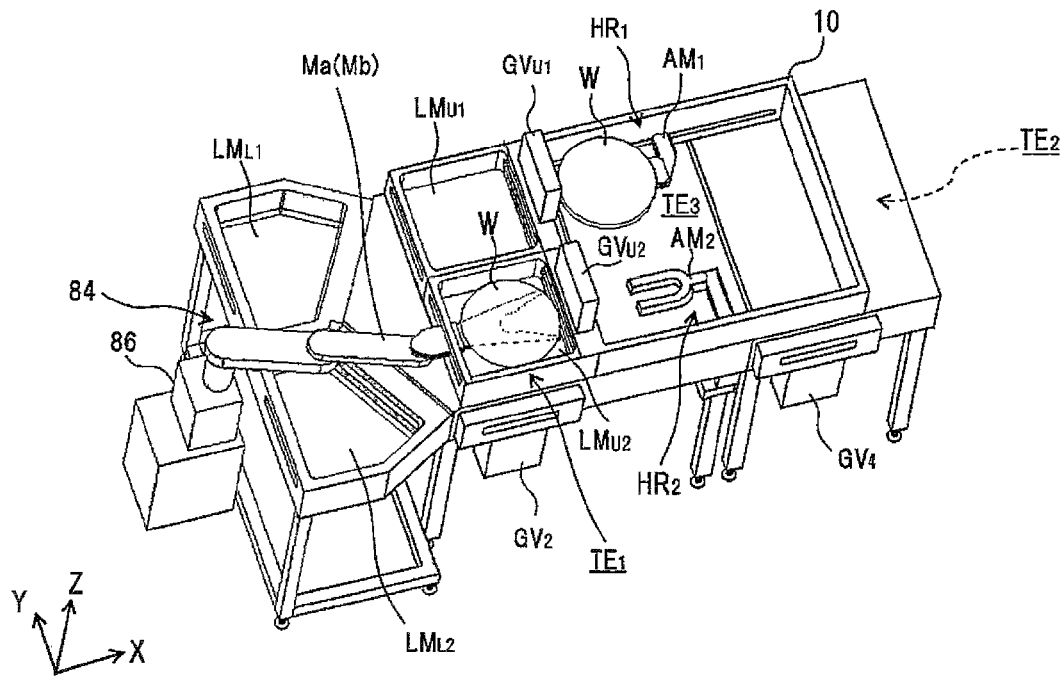
FIG. 9 is a perspective view illustrating a type of the modified embodiment of FIG. 8.

In addition, as illustrated in FIG. 9, when the space occupied by the first set (first floor) of the load-lock modules $LM_{L1}$, $LM_{L2}$ is increased in the system width direction (Y-direction), the central portion of the front side area of both of load-lock modules $LM_{L1}$, $LM_{L2}$ may be widened in the atmosphere conveyance chamber and one atmosphere conveyance robot 84 may be arranged therein. The atmosphere conveyance robot 84 is configured as a vertical articulated robot which is not provided with a horizontal slide shaft, and includes a body 86 and a pair of arms Ma, Mb (only one arm is illustrated) which extend to the air from the body 86 and are rotated by a plurality of rotation shafts. Each of the arms $M_a$, $M_b$ is configured to be capable of holding or supporting one semiconductor wafer W using a fork-type end-effector. In addition, the atmosphere conveyance robot 84 is accessible to all the wafer cassettes CR on the load ports $LP_2$, $LP_3$, $LP_4$ and all the load-lock modules $LM_{L1}$, $LM_{L2}$, $LM_{U1}$, $LM_{U2}$ so that the atmosphere conveyance robot 84 may unload (carry-out)/introduce (carry-in) semiconductor wafers W one by one from/into the cassette CR or the load-lock module LM of the access place and exchange a processing-finished wafer $W_j$ and a non-processed wafer $W_i$ during one access by a pick and place method. Although the conveyance speed and conveyance efficiency of the atmosphere system deteriorate, it is possible to make the single atmosphere conveyance robot 84 bear the conveyance tasks shared by the two atmosphere conveyance robots 64, 66.

In addition, as another modified embodiment, although not illustrated, the second set (second floor) of load-lock modules $LM_{U1}$, $LM_{U2}$ may be arranged over the first set (first floor) of load-lock modules $LM_{L1}$, $LM_{L2}$ and the first vacuum conveyance area $TE_1$.

Figure 10:
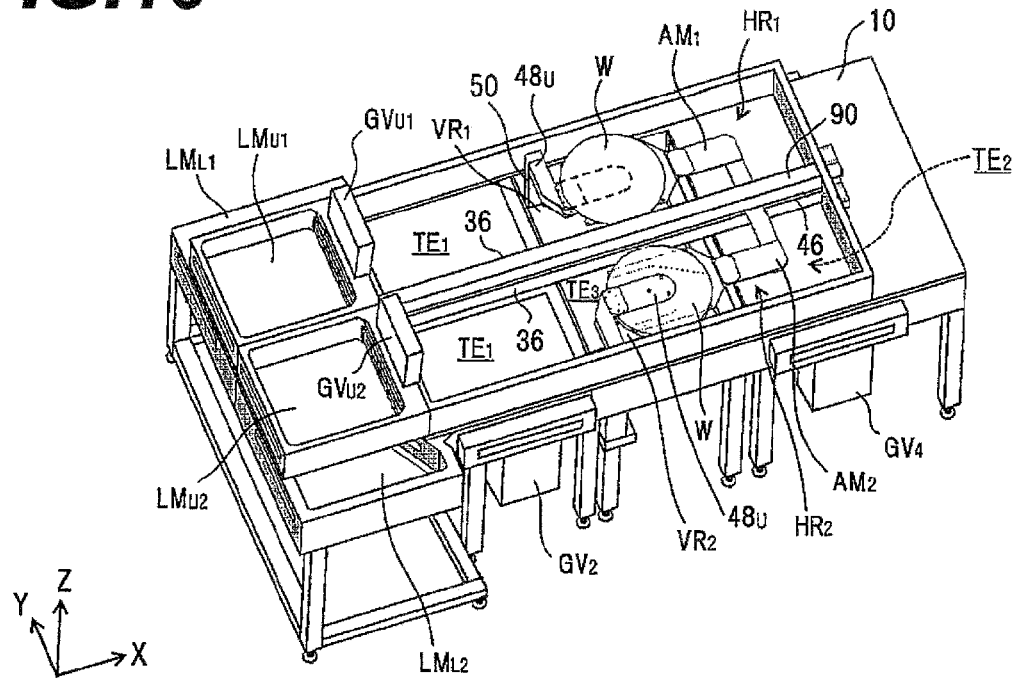
FIG. 10 is a perspective view illustrating another modified embodiment of the vacuum processing apparatus.

FIG. 10 illustrates a modified embodiment related to the horizontal conveyance units of the third vacuum conveyance robot 34. The modified embodiment is characterized by a configuration in which each of the rectilinear conveyance units 36, 36 is installed in a space between the left and right horizontal conveyance units $HR_1$, $HR_2$. For example, an elongated central frame 90 extending in the depth direction (X-direction) is installed between the horizontal conveyance units $HR_1$, $HR_2$ and the rectilinear conveyance units 36, 36 are attached to the opposite sides of the central frame 90, respectively. The lifting rods (lifting shafts) 50 of the left side vertical conveyance unit $VR_1$ and the right side vertical conveyance unit $VR_2$ are arranged adjacent to the left and right side walls of the vacuum conveyance chamber 10 to be opposed to the rectilinear conveyance units 36, 36 at the central frame 90 side, respectively.

According to this configuration, in the left side horizontal conveyance unit $HR_1$, when the arm $AM_1$ is moved in the depth direction (X-direction), the rectilinear conveyance unit 36 (especially, the arm support unit 44) moving along the central frame 90 does not interfere (collide) with the lifting rod (lifting shaft) 50 of the left side vertical conveyance unit $VR_1$. Thus, the left side horizontal conveyance unit $HR_1$ may retract the arm AM1 to the front side (in the vicinity of the load-lock module $LM_{U1}$) when giving and taking a semiconductor wafer W with the vertical conveyance unit $VR_1$. For example, just after a processing-finished semiconductor wafer W is moved from the buffer $48_U$ (or $48_L$) of the left side vertical conveyance unit $VR_1$ to the arm $AM_1$, it is possible to move the arm $AM_1$ forth in the state where the left side vertical conveyance unit $VR_1$ stays on the second floor, rather than retracting the arm $AM_1$ first to move the left side vertical conveyance unit $VR_1$ downward from the second floor to the first floor. Accordingly, the arm $AM_1$ which has received the processing-finished semiconductor wafer W may be instantly moved forth as it is to the interior of the load-lock module $LM_{U1}$. Thus, the conveyance speed or conveyance efficiency of the left side horizontal conveyance unit $HR_1$ may be enhanced. The right side horizontal conveyance unit $HR_2$, which has the same configuration as the left side horizontal conveyance unit $HR_1$, may perform the same conveyance operation as the left side horizontal conveyance unit $HR_1$.

In the above-described exemplary embodiment, the first and second vacuum conveyance areas $TE_1$, $TE_2$, the first and second sets of process modules $PM_1$ to $PM_4$, and the first set of load-lock modules $LM_{L1}$, $LM_{L2}$ are provided in the first floor of the vacuum conveyance chamber 10, and the third vacuum conveyance area $TE_3$ and the second set of the load-lock modules $LM_{U1}$, $LM_{U2}$ are provided in the second floor. However, a configuration, in which the first floor section and the second floor section within and around the vacuum conveyance chamber 10 are upside down, that is, the configuration, in which the first and second vacuum conveyance areas $TE_1$, $TE_2$, the first and second sets of process modules $PM_1$ to $PM_4$, and the first set of the load-lock modules $LM_{L1}$, $LM_{L2}$ are provided in the second floor of the vacuum conveyance chamber 10 and the third vacuum conveyance area $TE_3$ and the second set of load-lock module $LM_{U1}$, $LM_{U2}$ are provided in the first floor, may also be employed. In such a case, the first and second vacuum conveyance robots 30, 32 perform a wafer conveyance operation in the first and second vacuum conveyance areas $TE_1$, $TE_2$ which are separated from each other in the horizontal direction in the second floor of the vacuum conveyance chamber 10, respectively, and the third vacuum conveyance robot 34 performs a wafer conveyance operation in the first floor and the third vacuum conveyance area $TE_3$ which is widened to the aperture 13.

Further, for example, a configuration, in which the third vacuum conveyance robot 34 includes only one set of horizontal conveyance units HR and vertical conveyance units VR, or a configuration, in which one vacuum conveyance robot also includes each of the functions of the horizontal conveyance unit HR and the vertical conveyance unit VR, may also be employed.

A substrate to be processed in the present invention is not limited to a semiconductor wafer, and may be, for example, a FPD (Flat Panel Display) substrate or an arbitrary substrate which is subject to an optional processing by a cluster tool type vacuum processing apparatus.

DESCRIPTION OF SYMBOLS

10: vacuum conveyance chamber
12: chamber
15: loader module
16: load-lock chamber
30: first vacuum conveyance robot
32: second vacuum conveyance robot
34: third vacuum conveyance robot
60: first vacuum conveyance/processing section
62: second vacuum conveyance/processing section
64: first atmosphere conveyance robot
66: second atmosphere conveyance robot
84: atmosphere conveyance robot
$LP_1$ to $LP_4$: load port
$GV_1$ to $GV_4$: gate valve
$GV_{L1}$, $GV_{L2}$, $GV_{U1}$, $GV_{U2}$: gate valve
$DV_{L2}$, $DV_{U1}$, $DV_{U2}$: door valve
$HR_1$: left side horizontal conveyance unit
$HR_2$: right side horizontal conveyance unit
$VR_1$: left side vertical conveyance unit
$VR_2$: right side vertical conveyance unit
$TE_1$: first vacuum conveyance area
$TE_2$: second vacuum conveyance area
$TE_3$: third vacuum conveyance area
$TP_L$: first floor transfer position
$TP_U$: second floor transfer position

What is claimed is:

1. A vacuum processing apparatus comprising:
a vacuum conveyance chamber of which the interior is partitioned into an upper section and a lower section by a horizontal partition plate provided with an aperture at a central portion thereof;
first and second vacuum conveyance areas formed in the lower section within the vacuum conveyance chamber to be separated from each other in a horizontal direction;
a first set of process modules and a first set of load-lock modules arranged around the vacuum conveyance chamber adjacent to the first vacuum conveyance area;
a second set of process modules arranged around the vacuum conveyance chamber adjacent to the second vacuum conveyance area;
a first vacuum conveyance mechanism configured to access the first set of process modules and the first set of load-lock modules to give and take a substrate with each module of an access place and convey the substrate within the first vacuum conveyance area;
a second vacuum conveyance mechanism configured to access the second set of process modules to give and take a substrate with each module of an access place and convey the substrate within the second vacuum conveyance area;
a third vacuum conveyance area provided in the upper section within the vacuum conveyance chamber;
a second set of load-lock modules provided adjacent to the upper section within the vacuum conveyance chamber and arranged on a floor higher than the first set of load-lock modules;
and
a third vacuum conveyance mechanism configured to access the second set of load-lock modules to give and take a substrate with each module of an access place and to give and take the substrate with the second vacuum conveyance mechanism at a first transfer position formed at the aperture of the central portion in the third vacuum conveyance area so as to convey the substrate in the third vacuum conveyance area,
wherein the first vacuum conveyance mechanism includes a first pair of conveyance arms and each arm of the first pair of conveyance arms is configured to carry a substrate, so that the first pair of arms provide two substrate carrying locations and the second vacuum conveyance mechanism includes a second pair of conveyance arms and each arm of the second pair of conveyance arms is configured to carry a substrate so that the second pair of arms provide two substrate carrying locations, and
the first and second pairs of conveyance arms are each configured to continuously carry-out a processed substrate and carry-in a non-processed substrate.

2. The vacuum processing apparatus of claim 1, wherein the second set of load-lock modules are arranged above the first set of load-lock modules.

3. The vacuum processing apparatus of claim 1, wherein the second set of load-lock modules are arranged above the first vacuum conveyance area.

4. The vacuum processing apparatus of claim 1, wherein the second set of load-lock modules are arranged above the entirety of the first set load-lock modules and the first vacuum conveyance area.

5. The vacuum processing apparatus of claim 1, wherein the third vacuum conveyance mechanism includes a horizontal conveyance unit which is movable horizontally and a vertical conveyance unit which is movable up and down, the horizontal conveyance unit and the vertical conveyance unit being capable of giving and taking a substrate at a second transfer position formed above or below the first transfer position within the third vacuum conveyance area, the horizontal conveyance unit conveys a substrate between the second set of load-lock modules and the second transfer position, and the vertical conveyance unit conveys a substrate between the transfer position and the second transfer position.

6. The vacuum processing apparatus of claim 5, wherein the horizontal conveyance unit includes a first rectilinear mechanism configured to convey a substrate back and forth along a horizontal direction.

7. The vacuum processing apparatus of claim 5, wherein the horizontal conveyance unit includes a conveyance arm configured to hold or support substrates on one substrate basis.

8. The vacuum processing apparatus of claim 5, wherein the vertical conveyance unit includes a second rectilinear mechanism configured to convey a substrate only in a vertical direction.

9. The vacuum processing apparatus of claim 5, wherein the vertical conveyance unit includes a pair of buffers configured to be capable of placing or supporting two substrates simultaneously.

10. The vacuum processing apparatus of claim 5, wherein the second set of load-lock modules include a pair of load-lock modules arranged laterally in parallel to each other, and the third vacuum conveyance mechanism includes one pair of horizontal conveyance units provided laterally in parallel to each other to correspond to the one pair of load lock modules arranged laterally in parallel to each other, respectively, and configured to be operated independently from each other, and one pair of vertical conveyance units provided laterally in parallel to each other and configured to be operated independently from each other.

11. The vacuum processing apparatus of claim 1, further comprising:

a first load port provided at a predetermined position in an atmosphere space opposite to the first and second sets of load-lock modules so as to load or unload a cassette configured to accommodate a plurality of substrates in parallel to each other at a regular interval such that the plurality of substrates may enter into or exit from the cassette;

a first atmosphere conveyance mechanism configured to convey a substrate between a first cassette laid on the first load port and any one of the load-lock modules; and a second atmosphere conveyance mechanism configured to convey a substrate between the first cassette on the first load port and any one of other load-lock modules, wherein the first and second atmosphere conveyance mechanisms alternately discharge/charge substrates from/into the first cassette one by one.

12. The vacuum processing apparatus of claim 11, wherein the first atmosphere conveyance mechanism conveys a substrate between the first cassette and the first set of load-lock modules, and the second atmosphere conveyance mechanism conveys a substrate between the first cassette and the second set of load-lock modules.

13. The vacuum processing apparatus of claim 12, wherein, while the first atmosphere conveyance mechanism is accessing the first cassette so as to unload or load a substrate, the second atmosphere conveyance mechanism accesses the second set of load-lock modules so as to unload or load a substrate; and while the second atmosphere conveyance mechanism is accessing the first cassette so as to unload or load a substrate, the first atmosphere conveyance mechanism accesses the first set of load-lock modules so as to unload or unload a substrate.

14. The vacuum processing apparatus of claim 11, further comprising;

a second load port provided adjacent to the first load port within the atmosphere space, wherein the first and second atmosphere conveyance mechanisms also alternately unload or load substrates in relation to a second cassette laid on the second load port.

15. The vacuum processing apparatus of claim 11, wherein each of the first and second atmospheric conveyance mechanisms includes an articulated robot which is not provided with a horizontal slide shaft.

16. The vacuum processing apparatus of claim 1, wherein all the process modules belonging to the first set and all the process modules belonging to the second set repeatedly perform the same single process.

17. The vacuum processing apparatus of claim 1, the first set of process modules and the second set of process modules repeatedly perform the same composite process.

* * * * *